United States Patent
Hayashishita

(10) Patent No.: US 11,942,349 B2
(45) Date of Patent: *Mar. 26, 2024

(54) FILM FOR COMPONENT MANUFACTURE AND COMPONENT MANUFACTURING METHOD

(71) Applicant: MITSUI CHEMICALS TOHCELLO, INC., Tokyo (JP)

(72) Inventor: Eiji Hayashishita, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/588,985

(22) Filed: Jan. 31, 2022

(65) Prior Publication Data

US 2022/0157634 A1    May 19, 2022

Related U.S. Application Data

(63) Continuation of application No. 16/086,706, filed as application No. PCT/JP2017/010253 on Mar. 14, 2017, now Pat. No. 11,276,600.

(30) Foreign Application Priority Data

Mar. 31, 2016 (JP) ................................ 2016-072755

(51) Int. Cl.
*H01L 21/66* (2006.01)
*C09J 7/20* (2018.01)
(Continued)

(52) U.S. Cl.
CPC .............. *H01L 21/683* (2013.01); *C09J 7/20* (2018.01); *C09J 7/22* (2018.01); *C09J 201/00* (2013.01);
(Continued)

(58) Field of Classification Search
CPC .............. G01R 31/2831; G01R 1/0491; H01L 21/6836
See application file for complete search history.

(56) References Cited

U.S. PATENT DOCUMENTS 4,853,286 A * 8/1989 Narimatsu .............. B24B 37/30
216/33
5,605,844 A 2/1997 Oki et al.
(Continued)

FOREIGN PATENT DOCUMENTS

EP    2003685 A2    12/2008
EP    2284236 A1    2/2011
(Continued)

OTHER PUBLICATIONS

Office Action (The First Office Action) dated Nov. 2, 2022, by the State Intellectual Property Office of People's Republic of China in corresponding Chinese Patent Application No. 201780019314.8 and an English translation of the Office Action. (23 pages).

(Continued)

*Primary Examiner* — Scott W Dodds
(74) *Attorney, Agent, or Firm* — BUCHANAN, INGERSOLL & ROONEY PC

(57) ABSTRACT

Provided are a film for manufacturing semiconductor component, a film for electronic component manufacture, a method for manufacturing a semiconductor component using such a film for manufacturing semiconductor component, and a method for manufacturing an electronic component using such a film for electronic component manufacture. The film for component manufacture includes a base layer and an adhesive layer provided on one surface side of the base layer, and the Ra (μm) of the surface of one side of the base layer on which the adhesive layer is not provided is 0.1 to 2.0, and the Rz (μm) is 1.0 to 15. The method using (Continued)

the film for component manufacture includes a segmenting step, a pickup step, and an evaluation step prior to the pickup step.

8 Claims, 8 Drawing Sheets

(51) Int. Cl.
| | |
|---|---|
| C09J 7/22 | (2018.01) |
| C09J 201/00 | (2006.01) |
| H01L 21/67 | (2006.01) |
| H01L 21/677 | (2006.01) |
| H01L 21/683 | (2006.01) |
| B32B 43/00 | (2006.01) |
| G01R 1/04 | (2006.01) |
| G01R 31/28 | (2006.01) |
| H01L 21/02 | (2006.01) |

(52) U.S. Cl.
CPC .. *H01L 21/67092* (2013.01); *H01L 21/67098* (2013.01); *H01L 21/67721* (2013.01); *H01L 21/6836* (2013.01); *B32B 43/006* (2013.01); *C09J 2203/326* (2013.01); *G01R 1/0491* (2013.01); *G01R 31/2831* (2013.01); *H01L 21/0201* (2013.01)

(56) References Cited

U.S. PATENT DOCUMENTS

| | | | |
|---|---|---|---|
| 9,963,622 | B2 | 5/2018 | Nakajima et al. |
| 2004/0126575 | A1 | 7/2004 | Yoshida et al. |
| 2005/0191456 | A1 | 9/2005 | Hashimoto et al. |
| 2006/0220262 | A1 | 10/2006 | Meyer et al. |
| 2007/0066044 | A1 | 3/2007 | Abe et al. |
| 2008/0090085 | A1 | 4/2008 | Kawate et al. |
| 2008/0128884 | A1 | 6/2008 | Meyer et al. |
| 2010/0300612 | A1 | 12/2010 | Yamamoto et al. |
| 2012/0000599 | A1 | 1/2012 | Takatsu et al. |
| 2016/0108291 | A1 | 4/2016 | Masson et al. |
| 2016/0130481 | A1 | 5/2016 | Nakajima et al. |
| 2018/0142130 | A1 | 5/2018 | Hayashishita |
| 2018/0158697 | A1 | 6/2018 | Hayashishita |
| 2019/0103298 | A1 | 4/2019 | Hayashishita |

FOREIGN PATENT DOCUMENTS

| | | |
|---|---|---|
| EP | 2832808 A1 | 2/2015 |
| JP | 2006287235 A | 10/2006 |
| JP | 2007005436 A | 1/2007 |
| JP | 2010278065 A | 12/2010 |
| JP | 2011029331 A | 2/2011 |
| JP | 2013038408 A | 2/2013 |
| JP | 5163741 B2 | 3/2013 |
| JP | 2013197194 A | 9/2013 |
| JP | 2015096580 A | 5/2015 |
| JP | 2015156438 A | 8/2015 |
| JP | 2015-207650 A | 11/2015 |
| JP | 2015214658 A | 12/2015 |
| WO | 2010106849 A1 | 9/2010 |
| WO | 2012/026431 A1 | 10/2013 |
| WO | 2014184499 A1 | 11/2014 |
| WO | 2014199993 A1 | 12/2014 |
| WO | 2015190230 A1 | 12/2015 |

OTHER PUBLICATIONS

Office Action (Notification Letter of Review Opinion) dated Sep. 5, 2022, by the Intellectual Property Office, Ministry of Economic Affairs in corresponding Taiwanese Patent Application No. 106109435 and an English translation of the Office Action. (13 pages).
Office Action (Communication pursuant to Article 94(3) EPC) dated Feb. 7, 2023, by the European Patent Office in corresponding European Application No. 17774291.3. (5 pages).
International Search Report (PCT/ISA/210) dated May 30, 2017, by the Japanese Patent Office as the International Searching Authority for International Application No. PCT/JP2017/010253.
Written Opinion (PCT/ISA/237) dated May 30, 2017, by the Japanese Patent Office as the International Searching Authority for International Application No. PCT/JP2017/010253.
Office Action dated Jul. 7, 2020, by the Taiwan Intellectual Property Office in corresponding Taiwanese Patent Application No. 106109435, and an English translation of the Office Action. (22 pages).
Patent Rejection Decision dated Apr. 23, 2021, by the Taiwanese Patent Office in corresponding Taiwanese Patent Application No. 106109435 and an English translation of the Decision. (19 pages).
Notice of Reason for Refusal issued by the Korean Intellectual Property Office in corresponding Korean Patent Application No. 10-2018-7022726 dated Aug. 29, 2019, and partial English translation of the Notice. (11 pages).
Extended Search Report issued by the European Patent Office in corresponding European Patent Application No. 17774291.3-1102 dated Oct. 24, 2019. (8 pages).

\* cited by examiner

FILM FOR COMPONENT MANUFACTURE AND COMPONENT MANUFACTURING METHOD

CROSS-REFERENCE TO RELATED APPLICATIONS

This application is a continuation of U.S. patent application Ser. No. 16/086,706, filed on Sep. 20, 2018, now U.S. Pat. No. 11,276,600, which is a national stage of International Patent Application No. PCT/JP2017/010253, filed on Mar. 14, 2017, which in turn claims priority to Japanese Patent Application No. 2016-072755, filed on Mar. 31, 2016, the entire disclosures of all of which are incorporated herein by reference.

TECHNICAL FIELD

The present invention relates to a film for manufacturing semiconductor component, a method for manufacturing a semiconductor component, a film for electronic component manufacture, and a method for manufacturing an electronic component. More particularly, the present invention relates to a film for manufacturing semiconductor component which in manufacturing a semiconductor component from a semiconductor wafer, is bonded to a back surface of the semiconductor wafer to be used, a method for manufacturing a semiconductor component, a film for electronic component manufacture which in manufacturing an electronic component from an array-shaped electronic component, is bonded to a back surface of the array-shaped electronic component to be used, and a method for manufacturing an electronic component.

BACKGROUND ART

In recent years, a method is used in which after a wafer having circuits formed thereon is separated into segments, the segmented semiconductor components are evaluated (inspected), only semiconductor components passing the evaluation are rearranged on a carrier, and sealed in the form of an array with a sealant, and thereby, a large number of electronic components are manufactured collectively to realize a high yield. This type of a manufacturing method is disclosed in the following Patent Literature 1 (see FIG. 3A to FIG. 3E, paragraphs [0028] and [0029]).

Further, the following Patent Literature 2 discloses an adhesive film which can be used in separating a wafer having circuits formed thereon into segments. Further, the following Patent Literature 3 discloses an adhesive film which can be used in sealing the semiconductor component.

CITATIONS LIST

Patent Literature

Patent Literature 1: JP 2006-287235 A
Patent Literature 2: JP 2007-005436 A
Patent Literature 3: JP 2010-278065 A

SUMMARY OF INVENTION

Technical Problems

Although many semiconductor components are formed on one semiconductor wafer, there are latent ones that cause an initial failure when actually operating. Therefore, it is desirable not to introduce semiconductor components in which initial failure is concerned to the subsequent steps, to exclude the semiconductor components in the earlier stage, and to improve the yield rate of the final product. In this respect, in Patent Document 1, as an outline of arranging an excellent die which has been evaluated at an early stage (a semiconductor component obtained by dividing a wafer) so as to have a sufficient gap on the adhesive surface of the adhesive film described specifically, there is no mention as to what type of adhesive film can be used to realize this process.

The semiconductor manufacturing process is subdivided, and the support (adhesive film, tray, etc.) of adherends (semiconductor wafers, semiconductor components, electronic components, etc.) is changed according to the requirements of each step. For example, in order to obtain the above-mentioned "evaluated die", it is necessary to evaluate the semiconductor wafer. In the step of performing this evaluation, generally, the semiconductor wafer is fixed to the adhesive surface of the adhesive film, and furthermore, the back surface (non-adhesive surface) of the adhesive film is suctioned to the suction table and evaluated. In the evaluation step, a heating environment and a cooling environment are imposed. That is, even in a heating environment or a cooling environment, an operation evaluation for evaluating whether a semiconductor component operates normally or an acceleration evaluation with a thermal stress load is performed.

However, when these evaluations were made, it was found that there was a case that the adhesive film could not be removed from the suction table or it was difficult to remove the adhesive film after stopping suction on the adhesive film thereafter. The reason for this is believed that as a result of the use of the adhesive film in an environment accompanied by a change in temperature, the back surface of the adhesive film is firmly brought into close contact with the table surface of the suction table having a very high smoothness, so that vacuum break becomes impossible.

As described above, when the close contact state between the table surface and the adhesive film is unstable, for example, it changes from work to work, there is a problem that it is impossible to keep the force necessary for removing the adhesive film constant, resulting in a decrease in working efficiency.

The present invention has been made in view of the above problems, and it is an object of the present invention to provide a film for manufacturing semiconductor component and a film for electronic component manufacture which, even when used in an environment accompanied by a change in temperature, can be easily removed from a table surface after stopping suction and which can stabilize the close contact state with the table surface. Another object of the present invention is to provide a method for manufacturing a semiconductor component using such a film for manufacturing semiconductor component, and a method for manufacturing an electronic component using such a film for electronic component manufacture.

Solutions to Problems

That is, the present invention is as follows.

A film for manufacturing semiconductor component according to item 1 is a film for manufacturing semiconductor component used in a method for manufacturing a semiconductor component, the film comprising:

a base layer; and an adhesive layer provided on one surface side of the base layer,
wherein the arithmetic average roughness (Ra) of the surface of one side of the base layer on which the adhesive layer is not provided is 0.1 μm or more and 2.0 μm or less and the maximum height (Rz) is 1.0 μm or more and 15 μm or less.

The film for manufacturing semiconductor component according to item 2, wherein in the film for manufacturing semiconductor component according to item 1, the ratio $R_{E1}$ (=E'(100)/E'(25)) of the elastic modulus E'(100) of the base layer at 100° C. to the elastic modulus E'(25) of the base layer at 25° C. is such that $0.2 \leq R_{E1} \leq 1$, and the elastic modulus E'(25) is 35 MPa or more and 3500 MPa or less.

The film for manufacturing semiconductor component according to item 3, wherein in the film for manufacturing semiconductor component according to item 1 or 2, the ratio $R_{E2}$ (=E'(160)/E'(−40)) of the elastic modulus E'(160) of the base layer at 160° C. to the elastic modulus E'(−40) of the base layer at −40° C. is such that $0.01 \leq R_{E2} \leq 1$.

The film for manufacturing semiconductor component according to item 4, wherein in the film for manufacturing semiconductor component according to any one of items 1 to 3, the base layer contains at least one of a thermoplastic polyester-based elastomer, a thermoplastic polyamide-based elastomer, and polybutylene terephthalate.

The film for manufacturing semiconductor component according to item 5, wherein in the film for manufacturing semiconductor component according to any one of items 1 to 4, the method for manufacturing a semiconductor component includes: a segmenting step of separating a semiconductor wafer into segments in a state in which the adhesive layer is bonded to a back surface of the semiconductor wafer having circuits formed thereon to obtain semiconductor components;
a pickup step of separating the semiconductor components from the adhesive layer; and
an evaluation step of evaluating the semiconductor wafer or the semiconductor components in a temperature region of 25° C. or lower, or 75° C. or higher prior to the pickup step.

A method for manufacturing a semiconductor component according to item 6 includes:
a segmenting step of separating a semiconductor wafer into segments in a state in which an adhesive layer of a film for manufacturing semiconductor component is bonded to a back surface of the semiconductor wafer having circuits formed thereon to obtain semiconductor components;
a pickup step of separating the semiconductor components from the adhesive layer; and
an evaluation step of evaluating the semiconductor wafer or the semiconductor components in a temperature region of 25° C. or lower, or 75° C. or higher prior to the pickup step,
wherein the arithmetic average roughness (Ra) of the surface of one side of the base layer on which the adhesive layer is not provided is 0.1 μm or more and 2.0 μm or less and the maximum height (Rz) is 1.0 μm or more and 15 μm or less.

The method for manufacturing a semiconductor component according to item 7, wherein in the method for manufacturing a semiconductor component according to item 6, the ratio $R_{E1}$ (=E'(100)/E'(25)) of the elastic modulus E'(100) of the base layer at 100° C. to the elastic modulus E'(25) of the base layer at 25° C. is such that $0.2 \leq R_{E1} \leq 1$, and the elastic modulus E'(25) is 35 MPa or more and 3500 MPa or less.

The method for manufacturing a semiconductor component according to item 8, wherein in the method for manufacturing a semiconductor component according to item 6 or 7, the ratio $R_{E2}$ (=E'(160)/E'(−40)) of the elastic modulus E'(160) of the base layer at 160° C. to the elastic modulus E'(−40) of the base layer at −40° C. is such that $0.01 \leq R_{E2} \leq 1$.

The method for manufacturing a semiconductor component according to item 9, wherein in the method for manufacturing a semiconductor component according to any one of items 6 to 8, the base layer contains at least one of a thermoplastic polyester-based elastomer, a thermoplastic polyamide-based elastomer, and polybutylene terephthalate.

A film for electronic component manufacture according to item 10 is a film for electronic component manufacture used in a method for manufacturing an electronic component, the film comprising:
a base layer; and an adhesive layer provided on one surface side of the base layer, wherein the arithmetic average roughness (Ra) of the surface of one side of the base layer on which the adhesive layer is not provided is 0.1 μm or more and 2.0 μm or less, and the maximum height (Rz) is 1.0 μm or more and 15 μm or less.

The film for electronic component manufacture according to item 11, wherein in the film for electronic component manufacture according to item 10, the ratio $R_{E1}$ (=E'(100)/E'(25)) of the elastic modulus E'(100) of the base layer at 100° C. to the elastic modulus E'(25) of the base layer at 25° C. is such that $0.2 \leq R_{E1} \leq 1$, and the elastic modulus E'(25) is 35 MPa or more and 3500 MPa or less.

The film for electronic component manufacture according to item 12, wherein in the film for electronic component manufacture according to item 10 or 11, the ratio $R_{E2}$ (=E'(160)/E'(−40)) of the elastic modulus E'(160) of the base layer at 160° C. to the elastic modulus E'(−40) of the base layer at −40° C. is such that $0.01 \leq R_{E2} \leq 1$.

The film for electronic component manufacture according to item 13, wherein in the film for electronic component manufacture according to any one of items 10 to 12, the base layer contains at least one of a thermoplastic polyester-based elastomer, a thermoplastic polyamide-based elastomer, and polybutylene terephthalate.

The film for electronic component manufacture according to item 14, wherein in the film for electronic component manufacture according to any one of items 10 to 13, the method for manufacturing an electronic component includes: a segmenting step of separating an array-shaped electronic component, in which semiconductor components are sealed in an array configuration, into segments in a state in which the adhesive layer is bonded to a back surface of the array-shaped electronic component to obtain electronic components,
a pickup step of separating the electronic component from the adhesive layer; and an evaluation step of evaluating the array-shaped electronic component or the electronic components in a temperature region of 25° C. or lower, or 75° C. or higher prior to the pickup step.

A method for manufacturing an electronic component according to item 15 includes:
a segmenting step of separating an array-shaped electronic component, in which semiconductor components are sealed in an array configuration, into segments in a state in which an adhesive layer of a film for electronic component manufacture is bonded to a back surface of the array-shaped electronic component to obtain electronic components;

a pickup step of separating the electronic component from the adhesive layer; and an evaluation step of evaluating the array-shaped electronic component or the electronic components in a temperature region of 25° C. or lower, or 75° C. or higher prior to the pickup step, wherein the film for electronic component manufacture has a base layer and an adhesive layer provided on one surface side of the base layer, and the arithmetic average roughness (Ra) of the surface of one side of the base layer on which the adhesive layer is not provided is 0.1 μm or more and 2.0 μm or less and the maximum height (Rz) is 1.0 μm or more and 15 μm or less.

The method for manufacturing an electronic component according to item 16, wherein in the method for manufacturing an electronic component according to item 15, the ratio $R_{E1}$ (=E'(100)/E'(25)) of the elastic modulus E'(100) of the base layer at 100° C. to the elastic modulus E'(25) of the base layer at 25° C. is such that $0.2 \leq R_{E1} \leq 1$, and the elastic modulus E'(25) is 35 MPa or more and 3500 MPa or less.

The method for manufacturing an electronic component according to item 17, wherein in the method for manufacturing an electronic component according to item 15 or 16, the ratio $R_{E2}$ (=E'(160)/E'(−40)) of the elastic modulus E'(160) of the base layer at 160° C. to the elastic modulus E'(−40) of the base layer at −40° C. is such that $0.01 \leq R_{E2} \leq 1$.

The method for manufacturing an electronic component according to item 18, wherein in the method for manufacturing an electronic component according to any one of items 15 to 17, the base layer contains at least one of a thermoplastic polyester-based elastomer, a thermoplastic polyamide-based elastomer, and polybutylene terephthalate.

Advantageous Effects of Invention

According to the film for manufacturing semiconductor component of the present invention, even when the film is used in an environment accompanied by a change in temperature, it can be easily removed from a table surface after stopping suction and can stabilize the close contact state with the table surface.

According to the method for manufacturing a semiconductor component of the present invention, even when a film for manufacturing semiconductor component is used in an environment accompanied by a change in temperature, it is easy to remove the film for manufacturing semiconductor component from the table surface after stopping suction, and it is possible to stabilize the close contact state with the table surface, and therefore the semiconductor component can be efficiently manufactured.

According to the film for electronic component manufacture of the present invention, even when the film is used in an environment accompanied by a change in temperature, it can be easily removed from a table surface after stopping suction and can stabilize the close contact state with the table surface.

According to the method for manufacturing an electronic component of the present invention, even when a film for electronic component manufacture is used in an environment accompanied by a change in temperature, it is easy to remove the film for electronic component manufacture from the table surface after stopping suction, and it is possible to stabilize the close contact state with the table surface, and therefore the electronic component can be efficiently manufactured.

DESCRIPTION OF EMBODIMENTS

Hereinafter, the present invention will be described with reference to drawings. Subjects shown herein are illustrative one and one for describing embodiments of the present invention exemplarily, and are described for the purpose of providing one believed to be explanation in which the principles and conceptual characteristics of the invention can be understood most effectively and without any difficulty. In this point, the present invention shows clearly that the embodiments are necessary for fundamental comprehension of the present invention and how some embodiments of the present invention are embodied in practice by an explanation in connection with drawings without intending indication of a structural detail of the present invention above a certain level to those skilled in the art.

In the following description, items common to the film for manufacturing semiconductor component and the film for electronic component manufacture are sometimes described simply as "film for component manufacture".

[1] Film for Manufacturing Semiconductor Component

Figure 1:
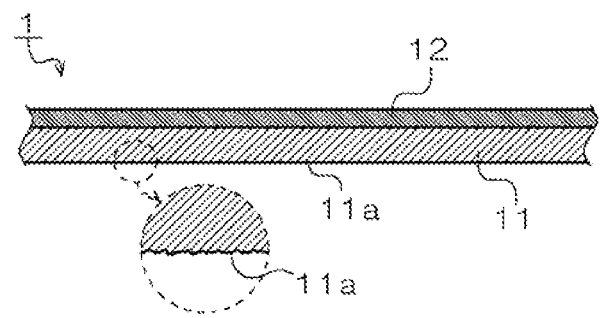
FIG. 1 is an illustrative drawing explaining a cross-section of an example of the present film for manufacturing semiconductor component.

A film 1 for manufacturing semiconductor component is a film used in a method for manufacturing a semiconductor component. The film 1 for manufacturing semiconductor component includes a base layer 11 and an adhesive layer 12 (see FIG. 1). The adhesive layer 12 is provided only on the other surface side of the base layer 11, and is not usually provided on one surface side of the base layer 11. Further, the base layer 11 and the adhesive layer 12 may be in direct contact with each other, or may be in contact with each other with another layer interposed between the base layer 11 and the adhesive layer 12.

<1> Base Layer

In the base layer 11, the arithmetic average roughness (Ra) of the surface of the one surface 11a on which the adhesive layer 12 is not provided is 0.1 μm or more and 2.0 μm or less and the maximum height (Rz) is 1.0 μm or more and 15 μm or less.

Thereby, even when it is used in an environment accompanied by a change in temperature, it is possible to prevent vacuum break from becoming impossible because one surface 11a of the film 1 for component manufacture is firmly brought into close contact with a table surface of the suction table 90 having high smoothness. Then, the film 1 for component manufacture can be easily removed from the table surface after the suction is stopped. In addition, it is possible to stabilize the close contact state between the table surface and the film 1 for component manufacture so as not to change for each operation, and it is possible to keep the force necessary for removing the film 1 for component manufacture constant. Therefore, the work efficiency is improved, and this is particularly advantageous in the case of automation.

Since the lower limit value of Ra is 0.1 μm or more and the lower limit value of Rz is 1.0 μm or more, it is possible to prevent effective vacuum breakdown from becoming impossible. On the other hand, when the upper limit value of Ra is 2.0 μm or less and the upper limit value of Rz is 15 μm or less, it is possible to prevent sufficient close contact from becoming impossible when the film 1 for component manufacture is suctioned to the suction table 90.

Among the above, Ra may be in the range of 0.1 μm or more and 2.0 μm or less, more preferably 0.15 μm or more and 1.9 μm or less, more preferably 0.17 μm or more and 1.8 μm or less, particularly preferably 0.19 μm or more and 1.7 μm or less, and particularly preferably 0.20 μm or more and 1.5 μm or less.

Further, Rz may be in the range of 1.0 μm or more and 15 μm or less, more preferably 1.5 μm or more and 14 μm or less, more preferably 2.0 μm or more and 13 μm or less, particularly preferably 2.2 μm or more and 12 μm or less, and particularly preferably 2.4 μm or more and 5.9 μm or less.

Also, it is preferred that the ratio of the elastic modulus E' of the base layer at a high temperature to the elastic modulus E' of the base layer at a normal temperature is within a predetermined range. Specifically, when the ratio of the elastic modulus E'(100) at 100° C. to the elastic modulus E'(25) at 25° C. is denoted by $R_{E1}$ (=E'(100)/E'(25)), the ratio $R_{E1}$ is preferably 0.2 or more and 1 or less (0.2≤$R_{E1}$≤1). Herein, "E'(100)" represents the tensile elastic modulus of the base layer at 100° C., and "E'(25)" represents the tensile elastic modulus of the base layer at 25° C.

As described above, in the case of 0.2≤$R_{E1}$≤1, it is possible to maintain the surface roughness at ordinary temperature even at a high temperature enough to such an extent that the surface roughness can function sufficiently. On the other hand, even when the base layer has $R_{E1}$<0.2, it can be used as a film for component manufacture, but in particular when it is attempted to obtain characteristics that a film is easily removed from the table surface after stopping suction at high temperature, it is necessary to further increase the surface roughness, and the suction efficiency tends to be lowered. Accordingly, it is preferred to set the ratio $R_{E1}$ to satisfy a relationship of 0.2≤$R_{E1}$≤1, in order to achieve an ease of removal from the table surface at high temperature while securing sufficient suction to the suction table from room temperature to high temperature The ratio $R_{E1}$ is preferably 0.2≤$R_{E1}$≤1, more preferably 0.23≤$R_{E1}$≤0.90, more preferably 0.25≤$R_{E1}$≤0.80, more preferably 0.28≤$R_{E1}$≤0.78, furthermore preferably 0.30≤$R_{E1}$≤0.75, furthermore preferably 0.31≤$R_{E1}$≤0.73, and furthermore preferably 0.33≤$R_{E1}$≤0.70.

In these preferred ranges, in particular, even at a high temperature, it is possible to make the film for component manufacture which is easily removed from the table surface after stopping suction and can stabilize the close contact state with the table surface. That is, when a high-temperature evaluation test is carried out using an suction table, the film for component manufacture is removed from the suction table without waiting for the temperature of the suction table to be lowered for each evaluation, and the next object to be evaluated can be placed on the suction table and the evaluation work can be carried out efficiently.

Here, the suction table is a device equipped with a table having a smooth top surface, and is a device capable of suctioning the film 1 for component manufacture on this smooth top surface by suction. For example, the suction table is also referred to a vacuum chuck table or the like.

The material constituting this table is not particularly limited; however, it usually has a structure capable of being suctioned, for example, a molded body (metal molded body, ceramic molded body, resin molded body or the like) having a suction hole and a porous molded body (metal molded body, ceramic molded body, resin molded body or the like) can be used. In particular, in the process of using a suction table having a metal table, the film 1 for component manufacture can effectively exert its action.

Further, within the range of 0.2≤$R_{E1}$≤1, E'(25) is preferably 35 MPa≤E'(25)≤3500 MPa, more preferably 40 MPa≤E'(25)≤3000 MPa, more preferably 42 MPa≤E'(25)≤2800 MPa, more preferably 44 MPa≤E'(25)≤2000 MPa, more preferably 46 MPa≤E'(25)≤1000 MPa, more preferably 48 MPa≤E'(25)≤500 MPa, more preferably 50 MPa≤E'(25)≤400 MPa, more preferably 58 MPa≤E'(25)≤350 MPa, more preferably 60 MPa≤E'(25)≤300 MPa, more preferably 65 MPa≤E'(25)≤250 MPa, more preferably 68 MPa≤E'(25)≤200 MPa, and more preferably 70 MPa≤E'(25)≤150 MPa. The value of E'(25) may be different in the MD direction and the TD direction of the base layer, but it is preferred that it is in the above-mentioned range in both the MD direction and the TD direction of the base layer.

On the other hand, E'(100) in the above case is preferably 7 MPa≤E'(100)≤3100 MPa, more preferably 10 MPa≤E'(100)≤3060 MPa, more preferably 12 MPa≤E'(100)≤2650 MPa, more preferably 15 MPa≤E'(100)≤2500 MPa, more preferably 16 MPa≤E'(100)≤2330 MPa, more preferably 17 MPa≤E'(100)≤2230 MPa, more preferably 18 MPa≤E'(100) ≤1960 MPa, more preferably 19 MPa≤E'(100)≤1000 MPa, more preferably 20 MPa≤E'(100)≤500 MPa, more preferably 21 MPa≤E'(100)≤250 MPa, more preferably 22 MPa≤E'(100)≤100 MPa, and more preferably 23 MPa≤E' (100)≤70 MPa. The value of E'(100) may be different in the MD direction and the TD direction of the base layer, but it is preferred that it is in the above-mentioned range in both the MD direction and the TD direction of the base layer.

Each elastic modulus E' related to the base layer is measured by a dynamic viscoelasticity measurement device (DMA: Dynamic Mechanical Analysis). Specifically, a sample size was set to a width of 10 mm, a distance between chucks was set to 20 mm, and measurement was carried out from −50° C. to 200° C. under the conditions of a frequency of 1 Hz and a temperature raising rate of 5° C./min, and data at each temperature was read from the resulting data to obtain the tensile elastic modulus. That is, a value at 25° C. is taken as a tensile elastic modulus E'(25), and a value at 100° C. is taken as a tensile elastic modulus E'(100).

In addition, it is preferred that the ratio of the elastic modulus E' of the base layer at a high temperature to the elastic modulus E' of the base layer at a low temperature is within a predetermined range. Specifically, the ratio of the elastic modulus E'(160) at 160° C. to the elastic modulus E'(−40) at −40° C. is denoted by $R_{E2}$ (=E'(160)/E'(—40)), the ratio $R_{E2}$ is preferably 0.01 or more and 1 or less (0.01≤$R_{E2}$≤1). Herein, "E'(160)" represents the tensile elastic modulus of the base layer at 160° C., and "E'(−40)" represents the tensile elastic modulus of the base layer at −40° C.

As described above, in the case of 0.01≤$R_{E2}$≤1, even when an evaluation step is performed in the respective temperature ranges of low temperature of −40° C. or higher and 0° C. or lower and/or high temperature of 100° C. or higher and 160° C. or lower at the time of manufacturing the semiconductor component, it is unnecessary to detach the semiconductor wafer or the semiconductor component from the film for component manufacture and to replace it with another film for component manufacture which is required in the next step, and then it is possible to use the film for component manufacture commonly to two or more different steps such as the evaluation step, the segmenting step, and the pickup step as in a process or the like.

More specifically, in recent years, semiconductor components are sometimes manufactured by the following procedures (1) and (2), for example.

(1) A procedure is that after a semiconductor wafer (before segmentation) is placed on a dedicated tray or adhesive film and evaluated in a wafer form, another adhesive film (another adhesive film having characteristic required in the next step) is bonded to the back surface (non-circuit surface) of the evaluated wafer, and then the wafer is separated into semiconductor components (dicing), the semiconductor components are picked-up from the adhesive film, and only the semiconductor components that passed the previous evaluation are bonded again to another adhesive film in order to use them in the subsequent steps.

(2) A procedure is that adhesive film (another adhesive film (another adhesive film having characteristic required in the next step) is bonded to the back surface (non-circuit surface) of the evaluated semiconductor wafer before evaluation (before segmentation), and then the semiconductor wafer is separated into semiconductor components (dicing), the semiconductor components are picked-up from the adhesive film, replaced in a dedicated tray, and only the semiconductor components that passed the previous evaluation are bonded again to another adhesive film in order to use them in the subsequent steps.

In any of these procedures, it is necessary to perform work to change the semiconductor components among a plurality of adhesive films or the like, the number of man-hours for replacement is large, and the kind of the adhesive film to be used also increases. Therefore, if there are films for component manufacture that can be commonly used in different steps, the above problem can be solved and the number of man-hours reduction and cost reduction can be realized.

On the other hand, in the present film for component manufacture, as described above, when including a characteristic of 0.2≤$R_{E1}$≤1 in addition to characteristics of 0.1≤Ra (μm)≤2.0 and 1.0≤Rz (μm)≤15, it is possible to use a film that is common over the steps from an evaluation step accompanied by a change in temperature to a pickup step (which can provide flexibility required in a pickup step) performed by stretching a film for semiconductor manufacture.

Further, as described above, when the film for semiconductor manufacture has the characteristics of 0.1≤Ra (μm) ≤2.0 and 1.0≤Rz (μm)≤15 and further have the characteristic of 0.2≤$R_{E1}$≤1, and in addition, the characteristic of 0.01≤$R_{E2}$≤1, it is also possible to meet an evaluation step having a high-temperature process or a low-temperature process, and it is possible to use a film that is common over the steps from such an evaluation step to a pickup step (which can provide flexibility required in a pickup step) performed by stretching the film for semiconductor manufacture.

As described above, there is no need to change to a dedicated adhesive film for each step, which is advantageous in terms of productivity of semiconductor components.

In addition to this, since either the evaluation step or the segmenting step (step of separating the semiconductor wafer into segments) can be performed while bonding the present film for component manufacture to the semiconductor wafer or the semiconductor component, any of these steps can be performed first, and flexibility of a step can be enhanced compared with the case of using a dedicated adhesive film or tray.

The ratio $R_{E2}$ is preferably 0.01≤$R_{E2}$≤1, more preferably 0.01≤$R_{E2}$≤0.9, more preferably 0.013≤$R_{E2}$≤0.7, more preferably 0.017≤$R_{E2}$≤0.5, furthermore preferably 0.020≤$R_{E2}$≤0.3, furthermore preferably 0.023≤$R_{E2}$≤0.2, furthermore preferably 0.025≤$R_{E2}$≤0.1, and furthermore preferably 0.027≤$R_{E2}$≤0.05. In these preferred ranges, particularly high sharing among steps can be exerted.

Further, it is preferred that E'(−40) is 10 MPa≤E'(−40) ≤4500 MPa in the range of 0.01≤$R_{E2}$≤1. In the present film for component manufacture, when the E'(−40) of the base layer is 10 MPa≤E'(−40)≤4500 MPa, the flexibility of the film for component manufacture can be maintained in a low temperature environment.

For example, sometimes the film 1 for component manufacture is used as a protecting member 15 (see FIG. 2) accompanied by a frame (ring frame, etc.) 7 as described later. In the evaluation steps (see R3' in FIG. 16), an article to be evaluated (semiconductor wafer 20 is exemplified in FIG. 16, but this can be applied to semiconductor component 21, array-shaped electronic component 50, electronic component 51) is subjected to an evaluation with a back surface of the article bonded to the adhesive layer 12 of the film 1 for component manufacture fixed to a protecting member 15. On this evaluation, in order to avoid contact between each part on the measuring device side such as the probe card 8 and the frame 7, jigs such as a stopper 91 are arranged on the inside of the frame 7, and the frame 7 is pressed downward (e.g., 0.5 to 15 mm), and thereby the frame 7 can be located away from the measuring equipment such as the probe card 8. In such a case, when the frame 7 is moved downward, the film 1 for component manufacture bonded to the frame 7 is stretched within an opening 71, and therefore the film 1 for component manufacture requires flexibility capable of following this movement. Moreover, as described later, the evaluation is also made at low temperatures, and the tensile elastic modulus E' at a low temperature of the base layer 11 is necessarily higher than the tensile elastic modulus E' at a high temperature, and therefore it is important to maintain the flexibility at a low temperature. As described above, in the film 1 for component manufacture required to undergo the evaluation step, it is preferred to be able to maintain the flexibility in a low temperature environment. However, a material easily attaining heat resistance under high temperature is usually a material having a high tensile elastic modulus at high temperature, and the tensile elastic modulus of such a material further increases at low temperature, and therefore it is difficult for the material to endure the above-mentioned conditions. In this respect, the film 1 for component manufacture in which the ratio $R_{E2}$ of the base layer 11 is $0.01 \leq R_{E2} \leq 1$ and E'(−40) is 10 MPa≤E'(−40)≤4500 MPa can satisfies the above requirement.

The E'(−40) is preferably 20 MPa≤E'(−40)≤4300 MPa, more preferably 50 MPa≤E'(−40)≤4200 MPa, more preferably 80 MPa≤E'(−40)≤4100 MPa, more preferably 100 MPa≤E'(−40)≤4000 MPa, more preferably 120 MPa≤E'(−40)≤3800 MPa, more preferably 150 MPa≤E'(−40)≤2500 MPa, more preferably, 200 MPa≤E'(−40)≤1400 MPa, more preferably 250≤E'(−40)≤500 MPa, and more preferably 300 MPa≤E'(−40)≤400 MPa. The value of E'(−40) may be different in the MD direction and the TD direction of the base layer, but it is preferred that it is in the above range in both the MD direction and the TD direction of the base layer.

On the other hand, E'(160) in the above case is preferably 0.1 MPa≤E'(160)≤600 MPa, more preferably 0.15 MPa≤E'(160)≤580 MPa, more preferably 0.2 MPa≤E'(160)≤560 MPa, more preferably 0.3 MPa≤E'(160)≤540 MPa, more preferably 0.4 MPa≤E'(160)≤520 MPa, more preferably 0.5 MPa≤E'(160)≤500 MPa, more preferably 0.6 MPa≤E'(160)≤100 MPa, more preferably 0.8 MPa≤E'(160)≤50 MPa, and more preferably 1 MPa≤E'(160)≤40 MPa. The value of E'(160) may be different in the MD direction and the TD direction of the base layer, but it is preferred that it is in the above-mentioned range in both the MD direction and the TD direction of the base layer.

Each elastic modulus E' related to the base layer is measured by a dynamic viscoelasticity measurement device (DMA: Dynamic Mechanical Analysis). Specifically, a sample size was set to a width of 10 mm, a distance between chucks was set to 20 mm, and measurement was carried out from −50° C. to 200° C. under the conditions of a frequency of 1 Hz and a temperature raising rate of 5° C./min, and data at each temperature was read from the resulting data to obtain the tensile elastic modulus. That is, a value at −40° C. is taken as a tensile elastic modulus E'(−40), and a value at 160° C. is taken as a tensile elastic modulus E'(160).

Further, a thickness of the base layer is not particularly limited, and it is preferably 50 μm or more and 200 μm or less, more preferably 80 μm or more and 200 μm or less, and particularly preferably 80 μm or more and 150 μm or less.

In addition, it does not matter whether the base layer is stretched or not stretched.

It is only necessary that the base layer has the above-mentioned various characteristics and can support the adhesive layer, and a material of the base layer is not particularly limited. A material constituting the base layer is preferably a resin.

Further, among resins, a resin having elastomeric properties is preferred from the viewpoint of achieving the various characteristics. Examples of the resin having elastomeric properties include thermoplastic elastomers, silicone and the like. These resins may be used singly, or may be used in combination of two or more thereof. Among these, a resin having thermoplasticity is preferred, and thermoplastic elastomers are preferred.

When the base layer contains the thermoplastic elastomer, the ratio of the thermoplastic elastomer to the whole resin constituting the base layer can be set to, for example, 30% by mass or more and 100% by mass or less. That is, the resin constituting the base layer may be composed of only a thermoplastic elastomer. A ratio of the thermoplastic elastomer is preferably 50% by mass or more and 100% by mass or less, and more preferably 70% by mass or more and 100% by mass or less.

The thermoplastic elastomer may be composed of a block copolymer having a hard segment and a soft segment or a polymer alloy of a hard polymer and a soft polymer, or may be one having characteristics of both of the block copolymer and the polymer alloy. Values of the elastic moduli E of the base layer can be controlled by adjusting these components constituting the base layer. That is, the values of the tensile elastic moduli can be controlled by adjusting kinds of resins, ratios of resins in the case of containing plural kinds of resins and molecular structures (ratios of the hard segment and the soft segment) of polymers constituting resins.

Examples of the thermoplastic elastomer include polyester-based thermoplastic elastomers, polyamide-based thermoplastic elastomers, styrene-based thermoplastic elastomers, olefin-based thermoplastic elastomers, vinyl chloride-based thermoplastic elastomers, polyimide-based thermoplastic elastomers (polyimide ester type, polyimide urethane type, etc.) and the like. These elastomers may be used singly, or may be used in combination of two or more thereof.

Among these thermoplastic elastomers, polyester-based thermoplastic elastomers, polyamide-based thermoplastic elastomers and polyimide-based thermoplastic elastomers are preferred, and polyester-based thermoplastic elastomers and/or polyamide-based thermoplastic elastomers are particularly preferred.

The polyester-based thermoplastic elastomer may have any constitution except for containing a polyester component as a hard segment. As the soft segment, polyester, polyether, polyether-ester or the like can be used. These elastomers may be used singly, or may be used in combination of two or more thereof. That is, for example, as the polyester component constituting the hard segment, a constituent unit derived from a monomer such as dimethyl terephthalate may be contained. On the other hand, as the component constituting the soft segment, a constituent unit derived from a monomer such as 1,4-butanediol and poly (oxytetramethylene)glycol, may be contained.

More specifically, PBT-PE-PBT type polyester-based thermoplastic elastomer and the like can be mentioned.

Specific examples of the polyester-based thermoplastic elastomers includes "PRIMALLOY (trade name)" manufactured by Mitsui Chemicals, Inc., "Hytrel (trade name)" manufactured by Du pont-Toray Co., Ltd., "PELPRENE (trade name)" manufactured by TOYOBO CO., LTD., "HYPER ALLOY ACTYMER (trade name)" manufactured by RIKEN TECHNOS CORPORATION, and the like. These elastomers may be used singly, or may be used in combination of two or more thereof.

The polyamide-based thermoplastic elastomer may have any constitution except for containing a polyamide component as a hard segment. As the soft segment, polyester, polyether, polyether-ester or the like can be used. These elastomers may be used singly, or may be used in combination of two or more thereof. That is, examples of the polyamide component constituting the hard segment include polyamide 6, polyamide 11, polyamide 12 and the like. These polyamide components may be used singly, or may be used in combination of two or more thereof. Various lactams and the like can be used as a monomer for these polyamide components. On the other hand, as the component constituting the soft segment, a monomer such as dicarboxylic acid or a constituent unit derived from polyether polyol, may be contained. As the polyether polyol among these, polyether diol is preferred, and examples thereof include poly(tetramethylene)glycol, poly(oxypropylene)glycol and the like. These elastomers may be used singly, or may be used in combination of two or more thereof.

More specific examples thereof include polyether amide type polyamide-based thermoplastic elastomers, polyester amide type polyamide-based thermoplastic elastomers, polyether ester amide type polyamide-based thermoplastic elastomers, and the like.

Specific examples of the polyamide-based thermoplastic elastomers include "Pebax (trade name)" manufactured by ARKEMA K. K., "DAIAMID (trade name)" manufactured by Daicel-Evonik Ltd., "VESTAMID (trade name)" manufactured by Daicel-Evonik Ltd., "UBESTA XPA (trade name)" manufactured by Ube Industries, Ltd., and the like. These elastomers may be used singly, or may be used in combination of two or more thereof.

When the base layer is a resin other than the thermoplastic elastomer, examples of such a resin include polyester, polyamide, polycarbonate, an acrylic resin and the like. These resins may be used singly, or may be used in combination of two or more thereof. Among these resins, polyester and/or polyamide is preferred, and specific examples thereof include polyesters such as polyethylene terephthalate, polybutylene terephthalate, polyethylene naphthalate and polybutylene naphthalate; and polyamides such as nylon 6 and nylon 12.

Furthermore, the base layer can contain various additives such as a plasticizer and a softener (mineral oil, etc.), fillers (carbonate, sulfate, titanate, silicate, oxides (titanium oxide, magnesium oxide), silica, talc, mica, clay, fiber filler, etc.), antioxidant, photostabilizer, anti-static agent, lubricant, coloring agent and the like in a resin constituting the base layer. These additives may be used singly, or may be used in combination of two or more thereof.

<2> Adhesive Layer

The adhesive layer 12 is a layer formed of an adhesive material and is usually provided only on the other surface of the base layer 11 (one surface 11a of the base layer 11 is a surface having characteristics of 0.1≤Ra (μm)≤2.0 and 1.0≤Rz (μm)≤15). The adhesive layer 12 may be disposed in direct contact with the base layer 11, or may be disposed on the base layer 11 with another layer interposed between the adhesive layer 12 and the base layer 11.

Furthermore, the adhesive force of the adhesive layer 12 is not particularly limited; however, it is preferred that the adhesive force to a silicon wafer (measured in an environment of a temperature of 23° C. and a relative humidity of 50%), measured according to JIS Z 0237, at the time when the adhesive layer 12 is peeled off from the surface of a silicon wafer after being bonded to the surface of a silicon wafer and left standing for 60 minutes, is 0.1 to 10 N/25 mm. When the adhesive force is within the above range, it is possible to suppress the adhesive residue when peeling off the adherend while ensuring good adhesion to the adherend (semiconductor wafer, semiconductor component, electronic component, etc.). This adhesive strength is more preferably 0.2 N/25 mm or more and 9 N/25 mm or less, and further preferably 0.3 N/25 mm or more and 8 N/25 mm or less.

A thickness (thickness of one surface side of the base layer 11) of the adhesive layer 12 is not particularly limited, and it is preferably 1 μm or more and 40 μm or less, more preferably 2 μm or more and 35 μm or less, and particularly preferably 3 μm or more and 25 μm or less.

The adhesive may have characteristics described above, and any material may be used. The adhesive usually includes at least an adhesive main agent. Examples of the adhesive main agent include an acrylic adhesive agent, a silicone-based adhesive agent, a rubber-based adhesive agent and the like. These adhesive agents may be used singly, or may be used in combination of two or more thereof. Among these adhesive agents, the acrylic adhesive agent is preferred.

Examples of the acrylic adhesive agent include a homopolymer of an acrylate compound, a copolymer of an acrylate compound and a comonomer, and the like. These adhesive agents may be used singly, or may be used in combination of two or more thereof.

Further, examples of the acrylate compound include methyl acrylate, ethyl acrylate, butyl acrylate, 2-ethylhexyl acrylate and the like. These acrylate compounds may be used singly, or may be used in combination of two or more thereof.

Furthermore, examples of the comonomer include vinyl acetate, acrylonitrile, acrylamide, styrene, methyl(meth)acrylate, (meth)acrylic acid, hydroxyethyl methacrylate, dimethylaminoethyl methacrylate, glycidyl methacrylate, maleic anhydride and the like.

Furthermore, the adhesive may contain a cross-linking agent other than the adhesive main agent. Examples of the cross-linking agent include epoxy-based cross-linking agents (pentaerythritol polyglycidyl ether, etc.), isocyanate-based cross-linking agents (diphenylmethane diisocyanate, tolylene diisocyanate, tetramethylene diisocyanate, hexamethylene diisocyanate, polyisocyanate, etc.). These cross-linking agents may be used singly, or may be used in combination of two or more thereof. When the cross-linking agent is contained in the adhesive, the content of the cross-linking agent is preferably set to 10 parts by mass or less with respect to 100 parts by mass of the whole adhesive. The adhesive force of the adhesive layer can be adjusted by the content of the cross-linking agent. Specifically, a method described in JP 2004-115591 A can be employed.

The adhesive agent may be an energy-curable adhesive which is cured by energy rays, or may be an energy-non-curing adhesive which is not cured by energy rays.

When the adhesive agent is the energy-curable adhesive, it is possible to cure the adhesive by irradiating the adhesive with energy rays to reduce the adhesive force thereof. Thus, the adhesive residue to the electronic component can be prevented with more reliability when the resulting electronic component (electronic component in which the semiconductor components are sealed in an array configuration) and the film for manufacturing semiconductor component are separated.

The energy-curable adhesive material may be one that is cured by any energy ray. Examples of the energy ray include ultraviolet rays, electron beam, infrared rays and the like. These energy rays may be used singly, or may be used in combination of two or more thereof. Specific examples thereof include an ultraviolet curable adhesive agent which is cured with ultraviolet rays.

When the adhesive is an energy-curable adhesive, the adhesive can contain a compound having a carbon-carbon double bond in a molecule (hereinafter, referred to as merely "curable compound") and a photo-polymerization initiator capable of initiating the polymerization of the curable compound in response to the energy rays other than the above-mentioned adhesive main agent. The curable compound is preferably a monomer, an oligomer and/or a polymer which has a carbon-carbon double bond in a molecule and can be cured through radical polymerization. Specific examples of the curable compound include trimethylolpropane tri(meth)acrylate, pentaerythritol tri (meth)acrylate, dipentaerythritol hexa(meth)acrylate, tetraethyleneglycol di(meth)acrylate, 1,6-hexanediol di(meth)acrylate, neopentylglycol di(meth)acrylate and the like. These curable compounds may be used singly, or may be used in combination of two or more thereof. When the curable compound is contained in the adhesive, the content of the curable compound is preferably 0.1 to 20 parts by mass with respect to 100 parts by mass of the adhesive.

In addition, the carbon-carbon double bond in a molecule may be contained by inclusion in a molecule of the adhesive main agent described above. That is, for example, the adhesive main agent can be an energy-curable polymer having a carbon-carbon double bond in a side chain. As described above, when the adhesive main agent has a curable structure in a molecule, the curable compound may be mixed, or does not have to be mixed.

On the other hand, as the photo-polymerization initiator, a compound capable of producing a radical by irradiation of energy rays is preferred. Specific examples of such a photo-polymerization initiator include acetophenone-based photo-polymerization initiators (methoxyacetophenone, etc.), α-ketol compounds (4-(2-hydroxyethoxy)phenyl (2-hydroxy-2-propyl)ketone, α-hydroxycyclohexyl phenyl ketone, etc.), ketal-based compounds (benzyl dimethyl ketal, etc.), benzoin-based photo-polymerization initiators (benzoin, benzoin alkyl ethers (benzoin methyl ether, benzoin isopropyl ether, benzoin isobutyl ether), etc.), benzophenone-based photo-polymerization initiators (benzophenone, benzoylbenzoic acid, etc.), aromatic ketals (benzyl dimethyl ketal, etc.), and the like. These photo-polymerization initiators may be used singly, or may be used in combination of two or more thereof. When the photo-polymerization initiator is contained in the adhesive, the content of the photo-polymerization initiator is preferably set to 5 to 15 parts by mass with respect to 100 parts by mass of the adhesive.

<3> Other Layers

The film 1 for the present component manufacture may include only the base layer 11 and the adhesive layer 12, or may include other layers. Examples of other layers include a projection-depression absorbing layer which can absorb a projection and depression shape of a bonding plane to make a film surface smooth, an interface-strength improving layer which improves strength of an interface with the adhesive, a migration preventive layer which suppresses the migration of a low molecular weight component from a base material to an adhesive surface, and the like. These layers may be used singly, or may be used in combination of two or more thereof.

<4> Manufacture of Film for Manufacturing Semiconductor Component

The present film for manufacturing semiconductor component may be manufactured by any method, and the method is not particularly limited. Specifically, the film can be manufactured by a method such as a co-extrusion method, an extrusion lamination method, an adhesive lamination method or an application method. Among these methods, the co-extrusion method is a method in which a molten resin serving as the adhesive layer 12 is laminated on a molten resin serving as the base layer 11 by co-extrusion to manufacture a film for manufacturing semiconductor component.

The extrusion lamination method is a method of laminating a molten resin serving as the adhesive layer 12 on the base layer 11 by extrusion to manufacture a film for manufacturing semiconductor component.

Furthermore, the application method is a method of laminating a molten resin serving as the adhesive layer 12 on the base layer 11 by application or coating to manufacture a film for manufacturing semiconductor component. When the energy-curable adhesive is used as an adhesive constituting the adhesive layer 12, the application method is preferably used.

Further, the adhesive lamination method is a method of laminating the adhesive layer 12 on the base layer 11 through thermocompression bonding, an adhesive or hot-melt to manufacture a film for manufacturing semiconductor component.

These methods may be used singly, or may be used in combination of two or more thereof.

Furthermore, as described above, regardless of whether the film for component manufacture is manufactured by any of a co-extrusion method, an extrusion lamination method, an adhesion lamination method, a coating method and the like, the base layer 11 can be formed by an appropriate method such as an extrusion molding method, a calendar It can be formed by an appropriate method such as an extrusion molding method or a calendar molding method.

One surface 11a of the present base layer 11 of the film 1 for component manufacture has a predetermined surface roughness. The one surface 11a having this predetermined surface roughness may be provided at the time of forming the base layer 11 or may be provided after the formation.

For example, when a predetermined surface roughness is provided at the time of forming the base layer 11, and extrusion molding is used, the sheet extruded from the extruder is passed through a roll having a predetermined surface unevenness (a satin roll or the like) to transfer the surface unevenness of the roll to the sheet, and thereby, the base layer 11 provided with a predetermined surface roughness can be formed.

When a predetermined surface roughness is provided at the time of forming the base layer 11, and calendar molding is used, the softened or melted resin is kneaded and rolled between a plurality of rolls to be formed into a film, and in a step after the calendering step, the base layer 11 having a predetermined surface roughness provided can be formed by passing the film through a roll having a predetermined surface unevenness (satin roll, etc.) to transfer the unevenness on the surface of the roll to a sheet.

The surface roughness of the surface of the base layer 11 opposite to the one surface 11a is not particularly limited. From the viewpoint of forming the adhesive layer 12, when the opposite surface of the one surface 11a and the adhesive layer 12 can be formed with good adhesion, even if the surface is smoother, the arithmetic average roughness (Ra) of the surface or the maximum height (Rz) may be large.

Further, when providing a predetermined surface roughness after formation of the base layer 11, it is possible to provide predetermined surface roughness by passing a smooth film previously formed through a roll having a predetermined surface unevenness (satin roll or the like) to transfer the surface unevenness of the roll to the film. At this time, the film can be heated as necessary.

Furthermore, it is possible to provide a predetermined surface roughness by applying sand blasting to a smooth film previously formed.

Even in these cases, it is similarly preferred that the opposite surface of the one surface 11a of the base layer 11 is a smoother surface, unlike the one surface 11a, from the viewpoint of forming the adhesive layer 12.

[2] Method for Manufacturing Semiconductor Component

The present film 1 for component manufacture is used in a method for manufacturing a semiconductor component 21. The method for manufacturing a semiconductor component includes a segmenting step R4 (see FIG. 5), an evaluation step R3 (see FIG. 4) and/or an evaluation step R5 (see FIG. 6), and a pickup step R8 (see FIG. 9).

Among them, the segmenting step R4 (see FIG. 5) is a step of separating a semiconductor wafer 20 into segments in a state in which the adhesive layer 12 of the film 1 for manufacturing semiconductor component is bonded to a back surface of the semiconductor wafer 20 having circuits formed thereon to obtain semiconductor components 21.

Further, the pickup step R8 (see FIG. 9) is a step of separating the semiconductor component 21 from the adhesive layer 12.

Figure 9:
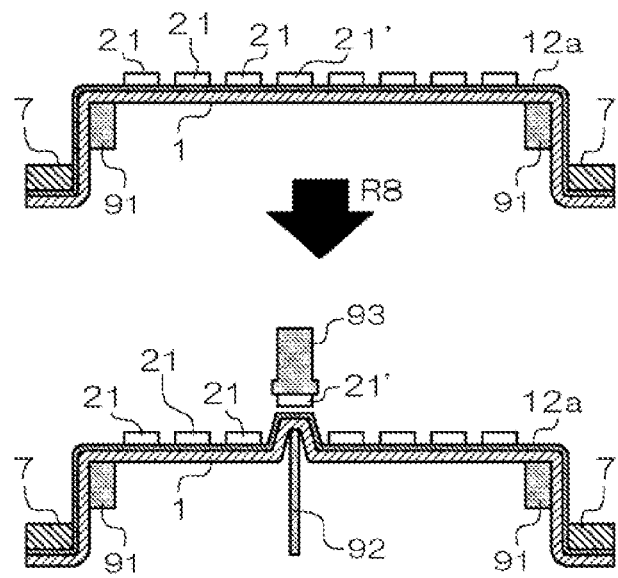
FIG. 9 is an illustrative drawing explaining a pickup step according to the present method for manufacturing a semiconductor component.

Then, the manufacturing method includes at least one step of the evaluation step R3 (see FIG. 4) and the evaluation step R5 (see FIG. 6) prior to the pickup step R8 (see FIG. 9). Of these steps, the evaluation step R3 is a step of evaluating the semiconductor wafer 20 in a temperature range of 25° C. or lower or 75° C. or higher. On the other hand, the evaluation step R5 is a step of evaluating the semiconductor component 21 in a temperature range of 25° C. or lower or 75° C. or higher.

Figure 5:
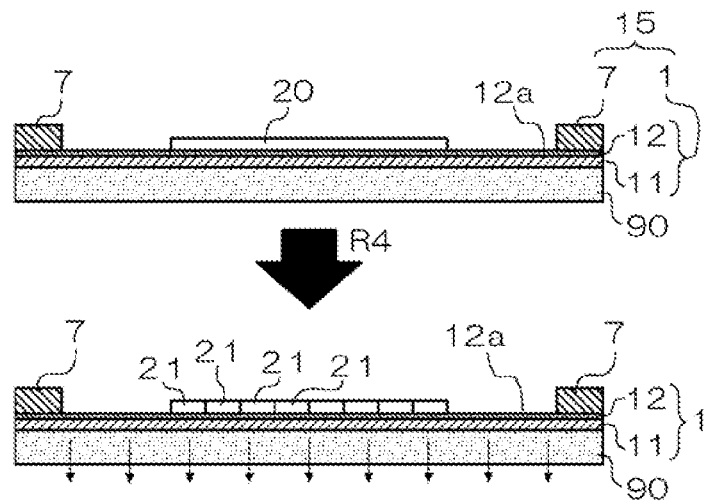
FIG. 5 is an illustrative drawing explaining a segmenting step according to the present method for manufacturing a semiconductor component.

Among the above steps, the bonding step R2 (see FIG. 3) is usually provided as a precedent step of the segmenting step R4 (see FIG. 5). The bonding step R2 (see FIG. 3) is a step of bonding the adhesive layer 12 of the film 1 for component manufacture to a back surface of the semiconductor wafer 20 having circuits formed thereon. Usually, the film for component manufacture is used as a protecting member 15 by bonding the adhesive layer 12 of the film 1 for component manufacture to one surface 7a of the frame 7 having an opening 71 so as to cover the opening 71 of the frame 7 (protecting member forming step R1, see FIG. 2). Further, the bonding step R2 (see FIG. 3) is a step of bonding a semiconductor wafer 20 to the surface 12a of the adhesive layer 12 that is exposed via the opening 71 of the frame 7 of the protecting member 15, and these protecting member forming step R1 (see FIG. 2) and bonding step R2 (see FIG. 3) are simultaneously performed. In addition, naturally, the protecting member forming step R1 (see FIG. 2) and the bonding step R2 (see FIG. 3) can also be performed separately, as required.

The semiconductor wafer 20 may be a semiconductor wafer which can be suitably bonded to the present film 1 for component manufacture, and a kind of the semiconductor wafer is not particularly limited, and examples thereof include a silicon substrate, a sapphire substrate, a germanium substrate, a germanium-arsenic substrate, a gallium-phosphorus substrate, a gallium-arsenic-aluminum substrate, and the like. Examples of the semiconductor wafer using the sapphire substrate among these semiconductor substrates include a semiconductor wafer in which a semiconductor layer (GaN, etc.) is laminated on the sapphire substrate. Circuits are usually formed on the surfaces of these semiconductor wafers. Examples of the circuits include a wiring, a capacitor, a diode, a transistor and the like. These substrates may be used singly, or may be used in combination of two or more thereof.

The segmenting step R4 (see FIG. 5) is a step of separating (dicing) a semiconductor wafer 20, a back surface of which a film 1 for component manufacture is bonded to, into segments to obtain semiconductor components 21. The segmenting step R4 can be appropriately performed using a publicly known method. In addition, the segmentation may be performed so that at least one semiconductor circuit region is contained in one semiconductor component 21, or may be performed so that two or more semiconductor circuit regions are contained in one semiconductor component 21.

The pickup step R8 (see FIG. 9) is a step of separating the segmented semiconductor components 21 from the adhesive layer 12 of the film 1 for component manufacture. The pickup step R8 can be appropriately performed using a publicly known method, and for example, as exemplified in FIG. 9, a semiconductor component 21', a pickup object, is pushed up with a pushing-up member 92 from a side of the base layer 11 of the film 1 for manufacturing semiconductor component, and the pushed-up semiconductor component 21' can be picked-up through a method such as suction or the like by a pickup instrument 93.

The evaluation step is a step of evaluating the semiconductor wafer 20 or the semiconductor component 21 prior to the pickup step R8. This evaluation step includes an evaluation step R3 (see FIG. 4) for evaluating the semiconductor wafer 20 prior to the segmenting step R4 and prior to the pickup step R8, and an evaluation step R5 (see FIG. 6) for evaluating the semiconductor component 21 after the segmenting step R4 and prior to the pickup step R8. Only any one of the evaluation step R3 and the evaluation step R5 may be performed, or both of them may be performed, as required.

An evaluation of the semiconductor wafer 20 or the semiconductor component 21 specifically includes the following (1) semiconductor wafer evaluation and the following (2) semiconductor component evaluation.

Of these, (1) semiconductor wafer evaluation is an evaluation made in a state of a semiconductor wafer, by use of a prober, on whether or not electrical properties of a plurality of circuits (corresponding to a circuit of each semiconductor component) formed on a semiconductor wafer, are desired properties in a predetermined temperature region (25° C. or lower, or 75° C. or higher).

On the other hand, (2) semiconductor component evaluation is an evaluation made in a state in which a semiconductor wafer is separated into segments and a plurality of semiconductor components are arranged in an array configuration, by use of a prober, on whether or not electrical properties of these semiconductor components are desired properties in a predetermined temperature region (25° C. or lower, or 75° C. or higher).

These evaluations include one intended to verify an operation in the above-mentioned temperature region and one intended for an accelerated endurance test in a predetermined temperature region (e.g., burn-in test).

Figure 4:
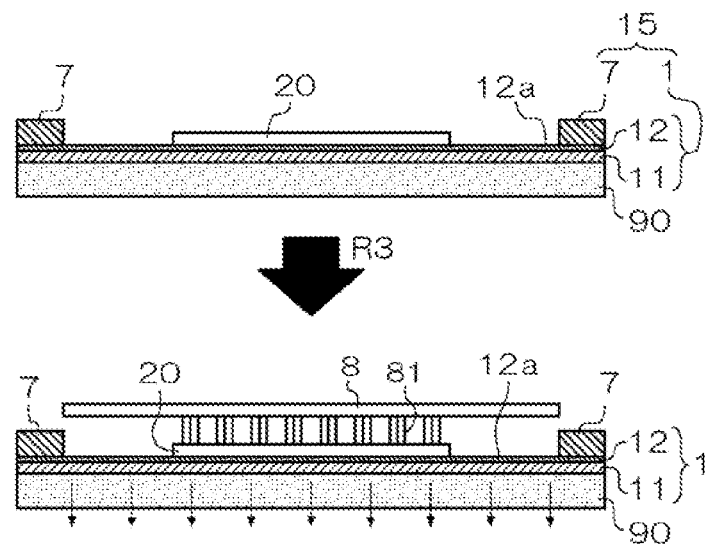
FIG. 4 is an illustrative drawing explaining an evaluation step according to the present method for manufacturing a semiconductor component.

When the evaluation step R3 (see FIG. 4) of the above-mentioned evaluation steps is performed, that is, when the evaluation is performed subsequent to the segmenting step R4 and prior to the pickup step R8 (evaluation is performed on a semiconductor wafer 20), for example, a probe card 8 having a plurality of probes 81 formed thereon is brought into contact with predetermined corresponding locations of the semiconductor wafer 20 to make electrical connection, and an evaluation is performed by determining whether a signal communicated between the probe 81 and a circuit formed on the semiconductor wafer 20 is right or wrong (probe test) (see FIG. 4).

In this case, as shown in FIG. 4, the film 1 for component manufacture is fixed to the frame body 7 of the protecting member 15, and in a state in which the back surface of the semiconductor wafer 20 is bonded to the adhesive layer 12 of the film, the measuring device such as a probe card 8 and the suction table 90 can be brought close to each other so that the probe 81 can be brought into contact with the surface of the semiconductor wafer 20.

Figure 16:
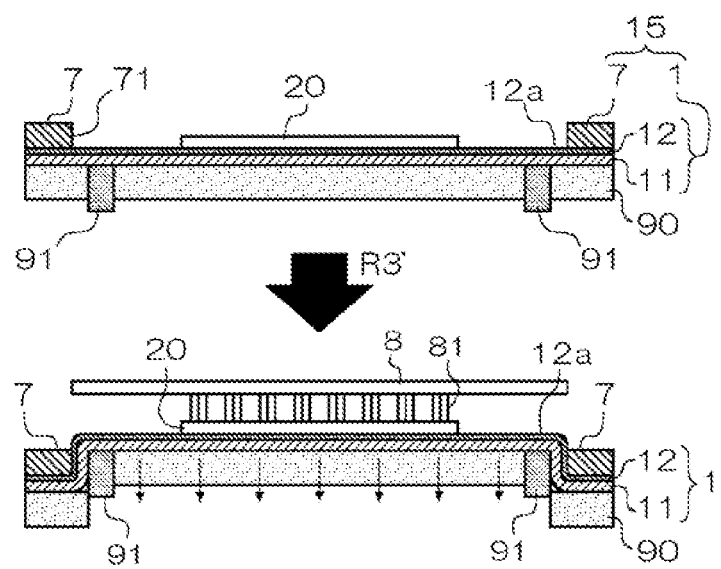
FIG. 16 is an illustrative drawing explaining an evaluation step according to the present method for manufacturing an electronic component.

In this case, as shown in FIG. 16, jigs such as the suction table 90 and the stopper 91 are arranged on the inside of the frame body 7 in order to avoid contact between each part on the measuring device side such as the probe card 8 and the frame body 7, and the frame body 7 can be pushed downward, and thereby, the frame body 7 can be prevented from coming into contact with the measuring device such as the probe card 8.

Figure 6:
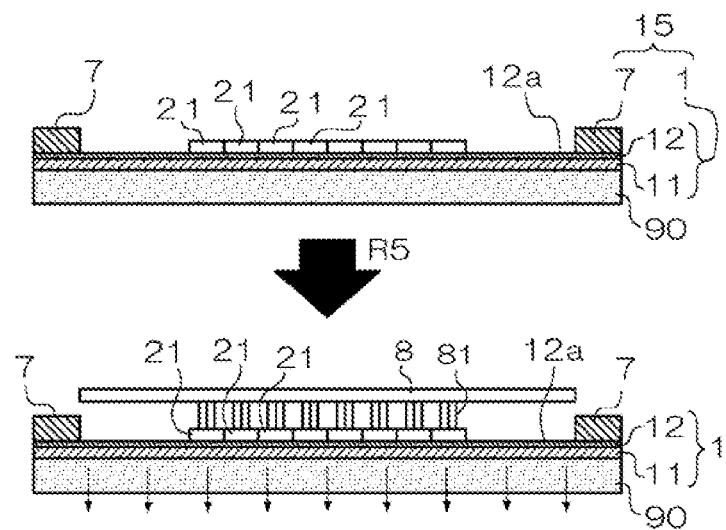
FIG. 6 is an illustrative drawing explaining an evaluation step according to the present method for manufacturing a semiconductor component.

On the other hand, as shown in FIG. 6, when the evaluation step R5 (see FIG. 6) of the above-mentioned evaluation steps is performed, that is, when the evaluation is performed subsequent to the segmenting step R4 and prior to the pickup step R8 (evaluation is performed on a semiconductor component 21), for example, a probe card 8 having a plurality of probes 81 formed thereon is brought into contact with predetermined corresponding locations of the semiconductor component 21 to make electrical connection, and an evaluation is performed by determining whether a signal communicated between the probe 81 and a circuit formed on the semiconductor component 21 is right or wrong (probe test) (see FIG. 6).

Similarly in this case, as shown in FIG. 16, the frame body 7 can be pushed downward, and thereby, the frame body 7 can be prevented from coming into contact with the measuring device such as the probe card 8.

These evaluations may include non-contact optical evaluation other than electrical evaluation (probe test) performed by bringing the probe 81 into contact as described above.

Further, the evaluation temperature range is not particularly limited, and it may be, for example, 25° C. or lower, or 75° C. or higher. Particularly, when the present film 1 for component manufacture has characteristics that $0.2 \leq R_{E1} \leq 1$ and 35 MPa$\leq$E'(25)$\leq$3500 MPa, the film has characteristics such that the film can withstand evaluation in at least a temperature range of 25° C. to 100° C.

Further, by having the characteristic of $0.01 \leq R_{E2} \leq 1$, even when the evaluation step is carried out at a temperature of −80° C. or higher and 0° C. or lower (further −60° C. or higher and −10° C. or lower, particularly −40° C. or higher and −10° C. or lower) on the low temperature side, the film 1 for component manufacture can maintain required flexibility in the evaluation process. Furthermore, the film 1 for component manufacture does not interfere with the pickup step R8 (see FIG. 9). That is, the film 1 for component manufacture maintains flexibility in pushing up the film 1 with the pushing-up member 92 in the pickup step R8, and the film 1 for component manufacture can be pushed up without being broken. Particularly, when the method includes the component-isolating step R7 (see FIG. 8) prior to the pickup step R8, the film 1 for component manufacture is further susceptible to break, but the break can be prevented to smoothly perform pickup by using the aforementioned film 1 for component manufacture.

Furthermore, even when the evaluation step is carried out at a temperature of 100° C. or higher and 170° C. or lower (further 110° C. or higher and 170° C. or lower, particularly 120° C. or higher and 160° C. or lower) on the high temperature side, the film 1 for component manufacture can maintain required flexibility in the evaluation process. Furthermore, the film 1 for component manufacture does not interfere with the pickup step R8 (see FIG. 9). That is, the film 1 for component manufacture maintains flexibility in pushing up the film 1 with the pushing-up member 92 in the pickup step R8, and the film 1 for component manufacture can be pushed up without being broken. Particularly, when the method includes the component-isolating step R7 (see FIG. 8) prior to the pickup step R8, the film 1 for component manufacture is further susceptible to break, but the break can be prevented to smoothly perform pickup by using the aforementioned film 1 for component manufacture.

Furthermore, these evaluations may be made only on any one of a low-temperature side and a high-temperature side; however, the present film 1 for component manufacture can be one which does not interfere with the pickup step R8 (see FIG. 9) even if these evaluations are made on both sides.

Figure 7:
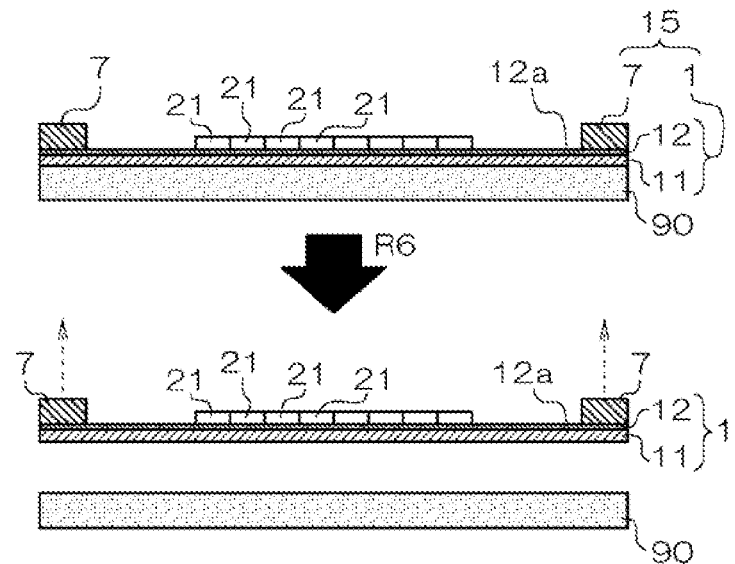
FIG. 7 is an illustrative drawing explaining a film-isolating step according to the present method for manufacturing a semiconductor component.

In the present manufacturing method, in general, the film-isolating step R6 (see FIG. 7) is further included other than the bonding step R2 (see FIG. 3), the evaluation step R3 (see FIG. 4), the segmenting step R4 (see FIG. 5), the evaluation step R5 (see FIG. 6) and the pickup step R8 (see FIG. 9).

The film-isolating step R6 (see FIG. 7) is a step of separating the suction table 90 and the film 1 for component manufacture from each other in a state in which the adherend (the semiconductor wafer 20 or the semiconductor component 21) is bonded to the film 1 for component manufacture. In the present method, since the above-mentioned film 1 for component manufacture is used, the surface of one side 11a of the base layer 11 on which the adhesive layer 12 is not provided satisfies $0.1 \leq Ra$ (μm)$\leq 2.0$ and $1.0 \leq Rz$ (μm)$\leq 15$, and this film-separating step R6 can be easily and stably carried out.

This film-isolating step R6 (see FIG. 7) can be performed, for example, between the evaluation step R5 (see FIG. 6) and the pickup step R8 (see FIG. 9). That is, this is a process required when changing the table (such as the suction table 90) on which the film 1 for component manufacture is placed.

In the present manufacturing method, other steps may be included other than the bonding step R2 (see FIG. 3), the evaluation step R3 (see FIG. 4), the segmenting step R4 (see FIG. 5), the evaluation step R5 (see FIG. 6), the film-isolating step R6 (see FIG. 7) and the pickup step R8 (see FIG. 9).

Figure 8:
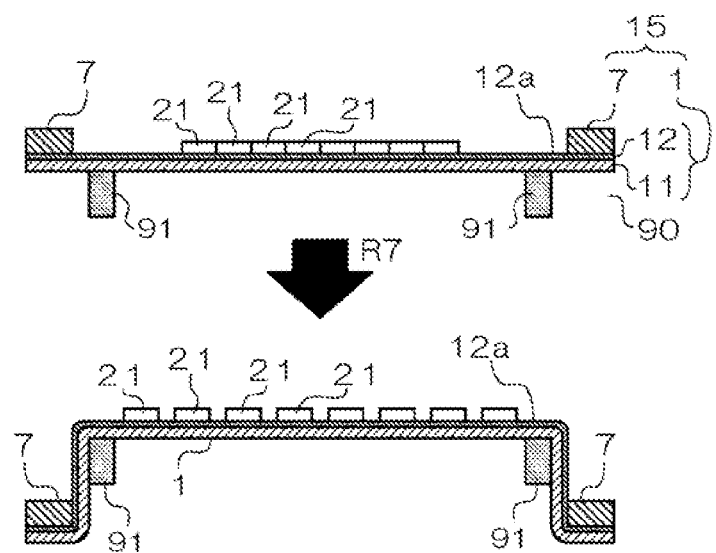
FIG. 8 is an illustrative drawing explaining a component-isolating step according to the present method for manufacturing a semiconductor component.

Examples of other steps include the protecting member forming step R1 (see FIG. 2) and the component-isolating step R7 (see FIG. 8).

Of these steps, the protecting member forming step R1 (see FIG. 2) is a step of bonding an adhesive layer 12 of the film 1 for manufacturing semiconductor component-to one surface 7a of the frame 7 having an opening 71 so as to cover the opening 71 of the frame 7.

As the frame 7, for example, a ring frame can be used. An outline of the frame 7 is not particularly limited, and it can appropriately have a shape responsive to necessity. For example, a circle, a quadrangle or the like can be employed. Similarly, an outline of the opening 71 is also not particularly limited, and can appropriately have a shape responsive to necessity, and for example, a circle, a quadrangle or the like can be employed. Also, a material constituting the frame 7 is not limited, and a resin and/or metal or the like can be used.

Further, heating may be performed as required when the adhesive layer 12 of the film 1 for manufacturing semiconductor component is bonded to one surface 7a of the frame 7 so as to cover the opening 71 of the frame 7.

The component-isolating step R7 (see FIG. 8) is a step of isolating the segmented semiconductor components 21 on the film 1 for component manufacture by stretching the film 1 for component manufacture. Stretching of the film 1 for component manufacture can be performed while abutting a stopper 91 against the inside of the frame 7.

[3] Film for Electronic Component Manufacture

A film 1 for electronic component manufacture of the present invention is a film used in a method for manufacturing an electronic component 51. The film 1 for electronic component manufacture has the same structure as the film 1 for manufacturing semiconductor component (see FIG. 1).

Accordingly, with respect to base layer 11 in the film 1 for electronic component manufacture, the aforementioned description (<1> Base Layer) of the base layer 11 in the film 1 for manufacturing semiconductor component can be applied as-is.

With respect to the adhesive layer 12 in the film 1 for electronic component manufacture, the aforementioned description (<2> Adhesive Layer) of the adhesive layer 12 in the film 1 for manufacturing semiconductor component can be applied as-is.

Further, with respect to the other layers in the film 1 for electronic component manufacture, the aforementioned description (<3> Other Layers) of the other layers in the film 1 for manufacturing semiconductor component can be applied as-is.

In the above-mentioned descriptions, the term "film for manufacturing semiconductor component" in the description about the film 1 for manufacturing semiconductor component is replaced with "base layer in the film 1 for electronic component manufacture", the term "semiconductor wafer" is replaced with "array-shaped electronic component", and the term "semiconductor component" is replaced with "electronic component".

With respect to the manufacture of the film for electronic component manufacture in the film 1 for electronic component manufacture, the aforementioned description (<4> Manufacture of Film for Manufacturing Semiconductor Component) of manufacture of the film for manufacturing semiconductor component in the film 1 for manufacturing semiconductor component can be applied as-is. Herein, the term "film for manufacturing semiconductor component" in the description about manufacturing of the film 1 for manufacturing semiconductor component is replaced with "film 1 for electronic component manufacture", the term "semiconductor wafer" is replaced with "array-shaped electronic component", and the term "semiconductor component" is replaced with "electronic component".

[4] Method for Manufacturing Electronic Component

The film 1 for electronic component manufacture is used in a method for manufacturing an electronic component 51. The method for manufacturing an electronic component includes a segmenting step R4 (see FIG. 11), an evaluation step R3 (see FIG. 10) and/or an evaluation step R5 (see FIG. 12), and a pickup step R8 (see FIG. 15).

Among these steps, the segmenting step R4 (see FIG. 11) is a step of separating (dicing) an array-shaped electronic component 50, a back surface of which a film 1 for component manufacture is bonded to, into segments to obtain electronic components 51.

The segmenting step R4 can be appropriately performed using a publicly known method. In addition, the segmentation may be performed so that at least one semiconductor component is contained in one electronic component 51, or may be performed so that two or more semiconductor components are contained in one electronic component 51.

Further, in the segmenting step R4 (see FIG. 11), as is the case with the film 1 for manufacturing semiconductor component, the frame 7 can be used as a protecting member 15 also in the present film 1 for electronic component manufacture.

The array-shaped electronic component 50 is one in which the semiconductor components are sealed in an array configuration. Specifically, the array-shaped electronic component 50 includes the following electronic components (1) to (3).

The array-shaped electronic component (1) is an array-shaped electronic component obtained by arraying, on a lead frame, semiconductor components (chip, die) obtained by separating the semiconductor wafer having circuits formed thereon into segments, performing wire bonding of the semiconductor components, and sealing the semiconductor components with a sealant.

Figure 10:
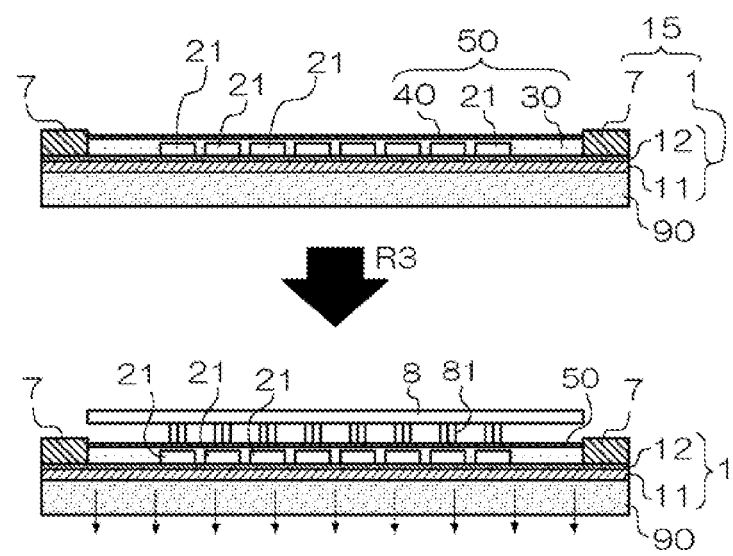
FIG. 10 is an illustrative drawing explaining an evaluation step according to a present method for manufacturing an electronic component.
Figure 11:
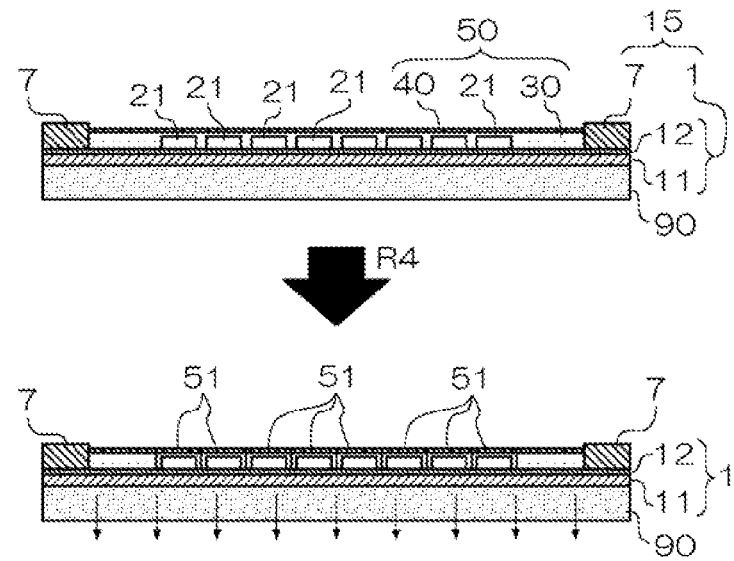
FIG. 11 is an illustrative drawing explaining a segmenting step according to the present method for manufacturing an electronic component.

The array-shaped electronic component (2) is an array-shaped electronic component 50 obtained by arraying, in a state of being apart from each other, semiconductor components 21 (chip, die) obtained by separating the semiconductor wafer having circuits formed thereon into segments, sealing the semiconductor components with a sealant 30, and then forming external circuits 40 attaining external conduction, such as a rewiring layer and a bump electrode, collectively (see FIG. 10 and FIG. 11). That is, the array-shaped electronic component (2) is an array-shaped electronic component obtained in a fan-out system (eWLB system).

The array-shaped electronic component (3) is an array-shaped electronic component obtained by using a semiconductor wafer as a semiconductor component as in a state of a wafer, and forming external circuits attaining external conduction, such as a rewiring layer and a bump electrode, and a sealing layer sealed with a sealant, collectively. The semiconductor wafer in the array-shaped electronic component (3) is in a state of pre-segmentation and includes a configuration in which semiconductor components (chip, die) are formed in an array configuration and a pattern in which a semiconductor wafer is used as a substrate (pattern in which a chip having a circuit is joined onto a non-circuit silicon substrate and used). That is, the array-shaped electronic component (3) is an array-shaped electronic component obtained in a wafer level chip size package (WLCSP) system.

In addition, in the array-shaped electronic component (2), the film for electronic component manufacture of the present invention can be used in forming the array-shaped electronic component (2). Specifically, an array-shaped electronic component can be obtained by arraying semiconductor components in a state of being apart from each other on the film 1 for electronic component manufacture, sealing the semiconductor components with a sealant, and then forming external circuits attaining external conduction, such as a rewiring layer and a bump electrode, collectively.

The evaluation step is a step of evaluating the array-shaped electronic component 50 or the electronic component 51 prior to the pickup step R8. This evaluation step includes an evaluation step R3 (see FIG. 10) for evaluating the array-type electronic component 50 prior to the segmenting step R4 and prior to the pickup step R8, and an evaluation step R5 (see FIG. 12) for evaluating the electronic component 51 after the segmenting step R4 and prior to the pickup step R8. Only any one of the evaluation step R3 and the evaluation step R5 may be performed, or both of them may be performed, as required.

An evaluation of the array-shaped electronic component 50 or the electronic component 51 specifically includes the following (1) array-shaped electronic component evaluation and the following (2) electronic component evaluation.

Of these, (1) array-shaped electronic component evaluation is an evaluation of the array-shaped electronic component 50 made as in the form of an array, by use of a prober, on whether or not electrical properties of internal circuits contained in the array-shaped electronic component 50 and external circuits (circuits for leading out the internal circuit) formed corresponding to these internal circuits are desired properties in a temperature region of 25° C. or lower, or 75° C. or higher.

On the other hand, (2) electronic component evaluation is an evaluation made in a state in which an array-shaped electronic component 50 is separated into segments and a plurality of electronic components 51 are arranged in an array configuration, by use of a prober, on whether or not electrical properties of these electronic components 51 are desired properties in a temperature region of 25° C. or lower, or 75° C. or higher.

These evaluations include one intended to verify an operation in the above-mentioned temperature region and one intended for an accelerated endurance test in the above-mentioned temperature region (e.g., burn-in test).

When the evaluation step R3 (see FIG. 10) of the above-mentioned evaluation steps is performed, that is, when the evaluation is performed subsequent to the segmenting step R4 and prior to the pickup step R8 (evaluation is performed on an array-shaped electronic component 50), for example, a probe card 8 having a plurality of probes 81 formed thereon is brought into contact with an external circuit (bump electrodes or the like) formed on the array-shaped electronic component 50 to make electrical connection, and an evaluation is performed by determining whether a signal communicated between the probe 81 and the external circuit formed on the array-shaped electronic component 50 is right or wrong (probe test) (see FIG. 10).

Also, in this case, as shown in FIG. 10, the film 1 for component manufacture is fixed to the frame body 7 of the protecting member 15, and in a state in which the back surface of the arrayed electronic component 50 is bonded to the adhesive layer 12 of the film, the measuring device such as a probe card 8 and the suction table 90 can be brought close to each other so that the probe 81 can be brought into contact with the surface of the array-shaped electronic component 50.

In this case, as shown in FIG. 16, jigs such as the suction table 90 and the stopper 91 are arranged on the inside of the frame body 7 in order to avoid contact between each part on the measuring device side such as the probe card 8 and the frame body 7, and the frame body 7 can be pushed downward, and thereby, the frame body 7 can be prevented from coming into contact with the measuring device such as the probe card 8.

Figure 12:
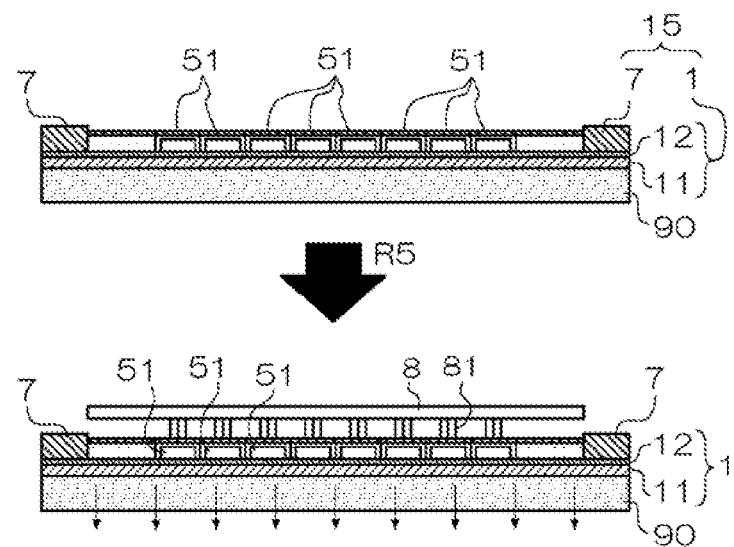
FIG. 12 is an illustrative drawing explaining an evaluation step according to the present method for manufacturing an electronic component.

On the other hand, as shown in FIG. 12, when the evaluation step R5 (see FIG. 12) of the evaluation steps is performed, that is, when the evaluation is performed subsequent to the segmenting step R4 and prior to the pickup step R8 (evaluation is performed on an electronic component 51), for example, a probe card 8 having a plurality of probes 81 formed thereon is brought into contact with predetermined corresponding locations of the electronic component 51 to make electrical connection, and an evaluation is performed by determining whether a signal communicated between the probe 81 and a circuit formed on the electronic component 51 is right or wrong (probe test) (see FIG. 12).

Similarly in this case, as shown in FIG. 16, the frame body 7 can be pushed downward, and thereby, the frame body 7 can be prevented from coming into contact with the measuring device such as the probe card 8.

These evaluations may include non-contact optical evaluation other than electrical evaluation (probe test) performed by bringing the probe 81 into contact as described above.

Further, the evaluation temperature range is not particularly limited, and it may be, for example, 25° C. or lower, or 75° C. or higher. Particularly, when the present film 1 for component manufacture has characteristics that $0.2 \leq R_{E1} \leq 1$ and 35 MPa$\leq$E'(25)$\leq$3500 MPa, the film has characteristics such that the film can withstand evaluation in at least a temperature range of 25° C. to 100° C.

Further, by having the characteristic of $0.01 \leq R_{E2} \leq 1$, even when the evaluation step is carried out at a temperature of −80° C. or higher and 0° C. or lower (further −60° C. or higher and −10° C. or lower, particularly −40° C. or higher and −10° C. or lower) on the low temperature side, the film 1 for component manufacture can maintain required flexibility in the evaluation process. Furthermore, the film 1 for component manufacture does not interfere with the pickup step R8 (see FIG. 15). That is, the film 1 for component manufacture maintains flexibility in pushing up the film 1 with the pushing-up member 92 in the pickup step R8, and the film 1 for component manufacture can be pushed up without being broken. Particularly, when the method includes the component-isolating step R7 (see FIG. 14) prior to the pickup step R8, the film 1 for component manufacture is further susceptible to break, but the break can be prevented to smoothly perform pickup by using the aforementioned film 1 for component manufacture.

Furthermore, even when the evaluation step is carried out at a temperature of 100° C. or higher and 170° C. or lower (further 110° C. or higher and 170° C. or lower, particularly 120° C. or higher and 160° C. or lower) on the high temperature side, the film 1 for component manufacture can maintain required flexibility in the evaluation process. Furthermore, the film 1 for component manufacture does not interfere with the pickup step R8 (see FIG. 15). That is, the film 1 for component manufacture maintains flexibility in pushing up the film 1 with the pushing-up member 92 in the pickup step R8, and the film 1 for component manufacture can be pushed up without being broken. Particularly, when the method includes the component-isolating step R7 (see FIG. 14) prior to the pickup step R8, the film 1 for component manufacture is further susceptible to break, but the break can be prevented to smoothly perform pickup by using the aforementioned film 1 for component manufacture.

Furthermore, these evaluations may be made only on any one of a low-temperature side and a high-temperature side; however, the present film 1 for component manufacture can be one which does not interfere with the pickup step R8 (see FIG. 15) even if these evaluations are made on both sides.

Figure 13:
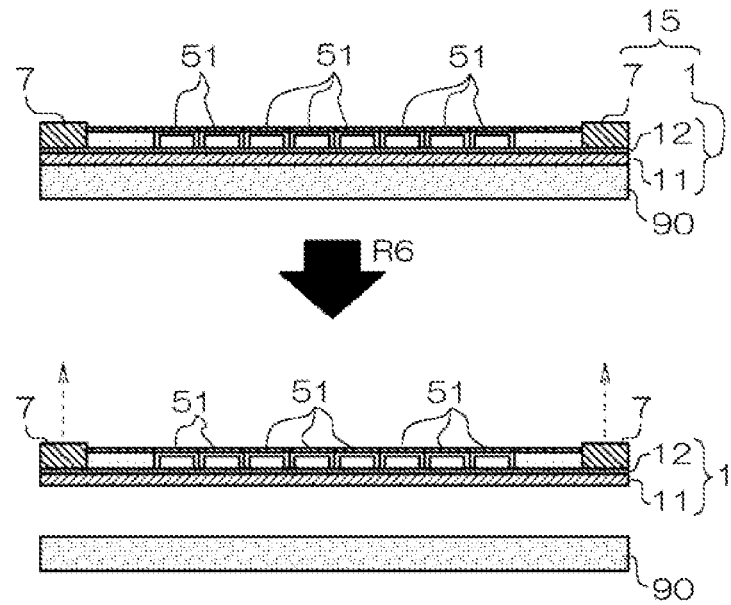
FIG. 13 is an illustrative drawing explaining a film-isolating step according to the present method for manufacturing an electronic component.
Figure 15:
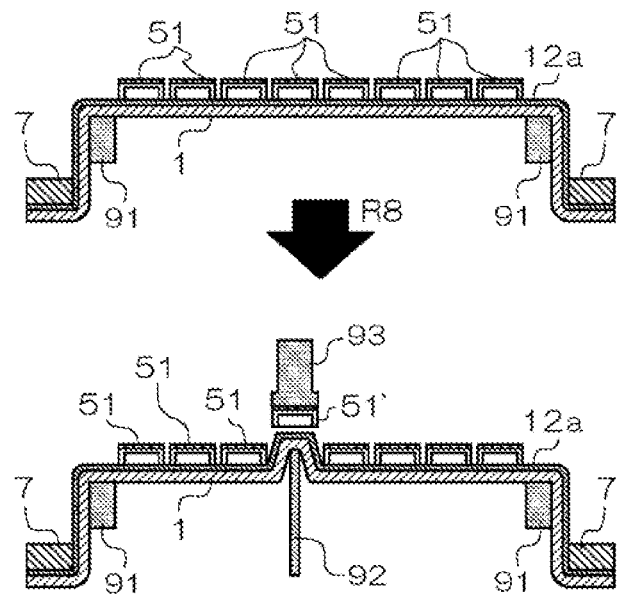
FIG. 15 is an illustrative drawing explaining a pickup step according to the present method for manufacturing an electronic component.

In the present manufacturing method, in general, the film-isolating step R6 (see FIG. 13) is further included other than the evaluation step R3 (see FIG. 10), the segmenting step R4 (see FIG. 11), the evaluation step R5 (see FIG. 12) and the pickup step R8 (see FIG. 15).

The film-isolating step R6 (see FIG. 13) is a step of separating the suction table 90 and the film 1 for component manufacture from each other in a state in which the adherend (the array-shaped electronic device 50 or the electronic component 51) is bonded to the film 1 for component manufacture. In the present method, since the above-mentioned film 1 for component manufacture is used, the surface of one side 11a of the base layer 11 on which the adhesive layer 12 is not provided satisfies $0.1 \leq Ra$ (μm)$\leq 2.0$ and $1.0 \leq Rz$ (μm)$\leq 15$, and this film-separating step R6 can be easily and stably carried out.

This film-isolating step R6 (see FIG. 13) can be performed, for example, between the evaluation step R5 (see FIG. 12) and the pickup step R8 (see FIG. 15). That is, this is a process required when changing the table (such as the suction table 90) on which the film 1 for component manufacture is placed.

In the present manufacturing method, other steps may be included other than the evaluation step R3 (see FIG. 10), the segmenting step R4 (see FIG. 11), the evaluation step R5 (see FIG. 12), the film-isolating step R6 (see FIG. 13) and the pickup step R8 (see FIG. 15).

Figure 14:
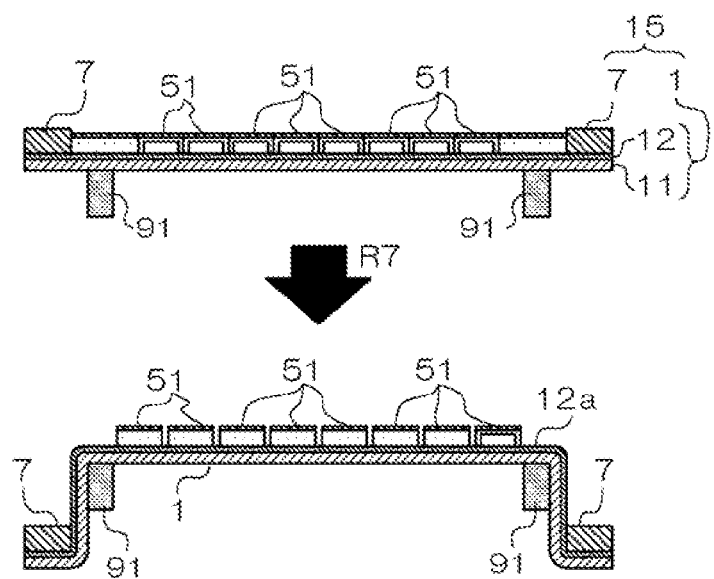
FIG. 14 is an illustrative drawing explaining a component-isolating step according to the present method for manufacturing an electronic component.

Examples of other steps include the component-isolating step R7 (see FIG. 14).

The component-isolating step R7 (see FIG. 14) is a step of isolating the segmented electronic components 51 on the film 1 for component manufacture by stretching the film 1 for component manufacture. Stretching of the film 1 for component manufacture can be performed while abutting a stopper 91 against the inside of the frame 7.

EXAMPLES

Hereinafter, the present invention will be specifically described by way of examples.

[1] Base Layer for Film for Component Manufacture

In order to manufacture a film for component manufacture, a base layer using various resins was prepared. Specifically, as a base layer 11, films for a base layer were prepared which were obtained by processing films of various resins, which will be described later, so as to have having a surface roughness in a predetermined range by each of a mirror finishing roll (1), a mirror finishing roll (2), a satin finishing roll (1), a satin finishing roll (2), a satin finishing roll (3), sandblast processing, and a satin finishing roll (4).

An arithmetic average roughness (Ra) and a maximum height (Rz) of each film serving as each base layer by each processing were measured with a small surface roughness tester (SJ-210, manufactured by Mitutoyo Corporation) in accordance with ISO 4287-1997. In this case, the reference length was 4.0 mm, the speed was 0.5 mm/s, and the cutoff was 0.8 mm.

As a result, the surface roughness by each processing is as follows.

Mirror finishing roll (1): Ra: 0.01 to 0.05, Rz: 0.35 to 0.55
Mirror finishing roll (2): Ra: 0.05 to 0.15, Rz: 0.60 to 0.70
Satin finishing roll (1): Ra: 0.20 to 0.35, Rz: 2.50 to 2.80
Satin finishing roll (2): Ra: 0.20 to 0.40, Rz: 3.00 to 3.20
Satin finishing roll (3): Ra: 0.50 to 0.70, Rz: 4.30 to 4.45
Sandblast processing: Ra: 0.55 to 0.70, Rz: 6.00 to 7.00
Satin finishing roll (4): Ra: 1.5, Rz: 10.7

[2] Manufacture of Film for Component Manufacture

Experiment Example 1

(1) Base Layer

As the base layer 11, 6 types (excluding satin finishing roll (4)) of films which were polyester-based thermoplastic elastomer (TPEE) films (melting point 200° C.) having a thickness of 80 μm and differ in the above-mentioned surface roughness, were used.

Using a film by the mirror finishing roll (1), a tensile elastic modulus E was measured by a dynamic viscoelasticity measurement device (DMA: Dynamic Mechanical Analysis) (product name: RSA-3, manufactured by TA Instruments Co.). Specifically, a sample size was set to a width of 10 mm, a distance between chucks was set to 20 mm, and measurement was carried out from −50° C. to 200° C. under the conditions of a frequency of 1 Hz and a temperature raising rate of 5° C./min, and the tensile elastic modulus at each temperature was read from the resulting data.

As a result, the tensile elastic modulus E'(−40) was 440 MPa, the tensile elastic modulus E'(25) was 95 MPa, the tensile elastic modulus E'(100) was 38 MPa, and the tensile elastic modulus E'(160) was 12 MPa.

Accordingly, $R_{E1}$ (=E'(100)/E'(25)) was 0.40, and $R_{E2}$ (=E'(160)/E'(−40)) was 0.03.

(2) Adhesive Layer

As an adhesive layer 12, a non-curable acrylic adhesive agent having a thickness of 10 μm was used.

(3) Lamination of Adhesive Layer on Base Layer

The adhesive layer 12 of the above (2) was laminated on one side of each of 6 types of the base layers 11 described in the above (1) to obtain the film 1 for component manufacture of Experiment Examples 1-1 to 1-6.

Using the obtained film 1 for component manufacture of Experiment Example 1, the adhesive strength was measured in accordance with JIS Z 0237 by the following method.

That is, the obtained film for component manufacture (the film processed by the mirror finishing roll (1)) was made into a test piece of 25 mm in width, and the adhesive layer 12 was pasted on a 4 inch silicon wafer while applying pressure with a rubber roll of about 2 kg. Then, the test piece was left standing for 60 minutes in an environment of a temperature of 23° C. and a relative humidity of 50%. Thereafter, an adhesive force at the time when the test piece was peeled off from the silicon wafer at a peeling speed of 300 mm/min in a direction of 180°, was measured. The measurement of the adhesive force was performed twice, and an average value thereof was taken as "adhesive force" (N/25 mm). As a result of this, the adhesive force of the film for component manufacture of Experiment Example 1 was 1.2 N/25 mm.

Experiment Example 2

As the base layer 11, 6 types (excluding satin finishing roll (4)) of films which were the same polyester-based thermoplastic elastomer films (melting point 200° C.) as in Experiment Example 1 except for having a thickness of 150 μm and differ in the above-mentioned surface roughness, were used.

As the adhesive layer 12, a non-curable acrylic adhesive agent having a thickness of 10 μm which was similar to that of Example 1, was used.

As with Experiment Example 1, the adhesive layer 12 was laminated on the base layer 11 to obtain films 1 for component manufacture of Experiment Examples 2-1 to 2-6. Using each of the obtained films for component manufacture of Experiment Example 2, the adhesive force was measured in the same manner as in Experiment Example 1, and consequently, the adhesive force was 1.2 N/25 mm.

Experiment Example 3

As the base layer 11, 6 types (excluding satin finishing roll (4)) of films which were nylon-based thermoplastic elastomer (TPAE) films (melting point 160° C.) having a thickness of 150 μm and differ in the above-mentioned surface roughness, were used.

Using each of the base layers 11 (films processed by a mirror finishing roll (1)), measurement was carried out in the same manner as in Experiment Example 1, and consequently, the tensile elastic modulus E'(−40) was 280 MPa, the tensile elastic modulus E'(25) was 72 MPa, the tensile elastic modulus E'(100) was 24 MPa, and the tensile elastic modulus E'(160) was 0.27 MPa.

Accordingly, $R_{E1}$ (=E'(100)/E'(25)) was 0.34, and $R_{E2}$ (=E'(160)/E'(−40)) was 0.001.

As the adhesive layer 12, a non-curable acrylic adhesive agent having a thickness of 10 μm which was similar to that of Example 1, was used.

As with Experiment Example 1, the adhesive layer 12 was laminated on the base layer 11 to obtain films 1 for component manufacture of Experiment Examples 3-1 to 3-6. Using each of the obtained films for component manufacture of Experiment Example 3, the adhesive force was measured in the same manner as in Experiment Example 1, and consequently, the adhesive force was 1.2 N/25 mm.

Experiment Example 4

As the base layer 11, 6 types (excluding satin finishing roll (4)) of films which were polyethylene terephthalate (PET) films (melting point 263° C.) having a thickness of 75 μm and differ in the above-mentioned surface roughness, were used.

Using each of the base layers 11 (films processed by a mirror finishing roll (1)), measurement was carried out in the same manner as in Experiment Example 1, and consequently, the tensile elastic modulus E'(−40) was 4000 MPa, the tensile elastic modulus E'(25) was 3000 MPa, the tensile elastic modulus E'(100) was 2150 MPa, and the tensile elastic modulus E'(160) was 550 MPa.

Accordingly, $R_{E1}$ (=E'(100)/E'(25)) was 0.72, and $R_{E2}$ (=E'(160)/E'(−40)) was 0.14.

As the adhesive layer 12, a non-curable acrylic adhesive agent having a thickness of 10 μm which was similar to that of Example 1, was used.

As with Experiment Example 1, the adhesive layer 12 was laminated on the base layer 11 to obtain films 1 for component manufacture of Experiment Examples 4-1 to 4-6. Using each of the obtained films for component manufacture of Experiment Example 4, the adhesive force was measured in the same manner as in Experiment Example 1, and consequently, the adhesive force was 1.2 N/25 mm.

Experiment Example 5

As the base layer 11, seven types of films which were polybutylene terephthalate (PBT) films (melting point 220° C.) having a thickness of 75 μm and differ in the above-mentioned surface roughness, were used.

Using each of the base layers 11 (films processed by a mirror finishing roll (1)), measurement was carried out in the same manner as in Experiment Example 1, and consequently, the tensile elastic modulus E'(−40) was 1500 MPa, the tensile elastic modulus E'(25) was 550 MPa, the tensile elastic modulus E'(100) was 138 MPa, and the tensile elastic modulus E'(160) was 90 MPa.

Accordingly, $R_{E1}$ (=E'(100)/E'(25)) was 0.25, and $R_{E2}$ (=E'(160)/E'(−40)) was 0.06.

As the adhesive layer 12, a non-curable acrylic adhesive agent having a thickness of 10 μm which was similar to that of Example 1, was used.

As with Experiment Example 1, the adhesive layer 12 was laminated on the base layer 11 to obtain films 1 for component manufacture of Experiment Examples 5-1 to 5-7. Using each of the obtained films for component manufacture of Experiment Example 5, the adhesive force was measured in the same manner as in Experiment Example 1, and consequently, the adhesive force was 1.2 N/25 mm.

Experiment Example 6

As the base layer 11, 6 types (excluding satin finishing roll (4)) of films which were random polypropylene (rPP) films (melting point 138° C.) having a thickness of 80 μm and differ in the above-mentioned surface roughness, were used.

Using each of the base layers 11 (films processed by a mirror finishing roll (1)), measurement was carried out in the same manner as in Experiment Example 1, and consequently, the tensile elastic modulus E'(−40) was 1500 MPa, the tensile elastic modulus E'(25) was 775 MPa, and the tensile elastic modulus E'(100) was 81 MPa. In addition, the tensile elastic modulus E'(160) was unmeasurable due to break.

Accordingly, $R_{E1}$ (=E'(100)/E'(25)) was 0.10, and $R_{E2}$ (=E'(160)/E'(−40)) was less than 0.01.

As the adhesive layer 12, a non-curable acrylic adhesive agent having a thickness of 10 μm which was similar to that of Example 1, was used.

As with Experiment Example 1, the adhesive layer 12 was laminated on the base layer 11 to obtain films 1 for component manufacture of Experiment Examples 6-1 to 6-6. Using each of the obtained films for component manufacture of Experiment Example 6, the adhesive force was measured in the same manner as in Experiment Example 1, and consequently, the adhesive force was 1.2 N/25 mm.

Experiment Example 7

As the base layer 11, 6 types (excluding satin finishing roll (4)) of films which were linear low density polyethylene (LLDPE) films (melting point 116° C.) having a thickness of 80 μm and differ in the above-mentioned surface roughness, were used.

Using each of the base layers 11 (films processed by a mirror finishing roll (1)), measurement was carried out in the same manner as in Experiment Example 1, and consequently, the tensile elastic modulus E'(−40) was 520 MPa, the tensile elastic modulus E'(25) was 118 MPa, and the tensile elastic modulus E'(100) was 12 MPa. In addition, the tensile elastic modulus E'(160) was unmeasurable due to break.

Accordingly, $R_{E1}$ (=E'(100)/E'(25)) was 0.10, and $R_{E2}$ (=E'(160)/E'(−40)) was less than 0.01.

As the adhesive layer 12, a non-curable acrylic adhesive agent having a thickness of 10 μm which was similar to that of Example 1, was used.

As with Experiment Example 1, the adhesive layer 12 was laminated on the base layer 11 to obtain films 1 for component manufacture of Experiment Examples 7-1 to 7-6. Using each of the obtained films for component manufacture of Experiment Example 7, the adhesive force was measured in the same manner as in Experiment Example 1, and consequently, the adhesive force was 1.2 N/25 mm.

Experiment Example 8

As the base layer 11, seven types of films which were polyester-based thermoplastic elastomer (TPEE) films (melting point 199° C.) having a thickness of 120 μm and differ in the above-mentioned surface roughness, were used.

Using each of the base layers 11 (films processed by a mirror finishing roll (1)), measurement was carried out in the same manner as in Experiment Example 1, and consequently, the tensile elastic modulus E'(−40) was 374 MPa, the tensile elastic modulus E'(25) was 56 MPa, the tensile elastic modulus E'(100) was 32 MPa, and the tensile elastic modulus E'(160) was 8.5 MPa.

Accordingly, $R_{E1}$ (=E'(100)/E'(25)) was 0.6, and $R_{E2}$ (=E'(160)/E'(−40)) was 0.02.

As the adhesive layer 12, a non-curable acrylic adhesive agent having a thickness of 10 μm which was similar to that of Example 1, was used.

As with Experiment Example 1, the adhesive layer 12 was laminated on the base layer 11 to obtain films 1 for component manufacture of Experiment Examples 8-1 to 8-7. Using each of the obtained films for component manufacture of Experiment Example 8, the adhesive force was measured in the same manner as in Experiment Example 1, and consequently, the adhesive force was 1.2 N/25 mm.

TABLE 1

|  |  | Experimental Examples | | | | | | | |
|---|---|---|---|---|---|---|---|---|---|
|  |  | 1 | 2 | 3 | 4 | 5 | 6 | 7 | 8 |
| Base Layer | Resin | TPEE | TPEE | TPAE | PET | PBT | r PP | LLDPE | TPEE |
|  | Thickness (μm) | 80 | 150 | 150 | 75 | 75 | 80 | 80 | 120 |
|  | E'(25) (Mpa) | 95 | 95 | 72 | 3000 | 550 | 775 | 118 | 56 |
|  | E'(100) (Mpa) | 38 | 38 | 24 | 2150 | 138 | 81 | 12 | 32 |
|  | $R_{E1}$ | 0.4 | 0.4 | 0.34 | 0.72 | 0.25 | 0.1 | 0.1 | 0.6 |
|  | E'(−40) (Mpa) | 440 | 440 | 280 | 4000 | 1500 | 1500 | 520 | 374 |
|  | E'(160) (Mpa) | 12 | 12 | 0.27 | 550 | 90 | break | break | 8.5 |
|  | $R_{E2}$ | 0.03 | 0.03 | 0.001 | 0.14 | 0.06 | ≤0.01 | ≤0.01 | 0.02 |
|  | Melting Point (° C.) | 200 | 200 | 160 | 263 | 220 | 138 | 116 | 199 |

[2] Test Using Film for Component Manufacture

The following test was carried out using Experiment Examples 1 to 8.

Figure 2:
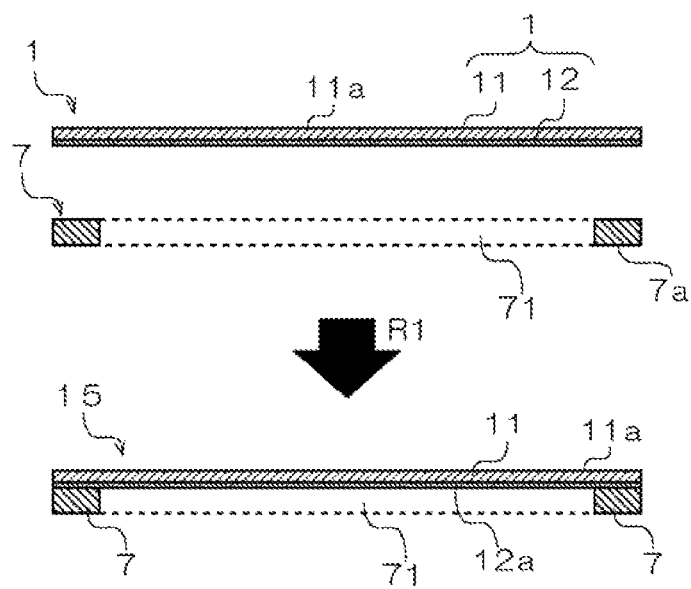
FIG. 2 is an illustrative drawing explaining a protecting member forming step according to a present method for manufacturing a semiconductor component.
Figure 3:
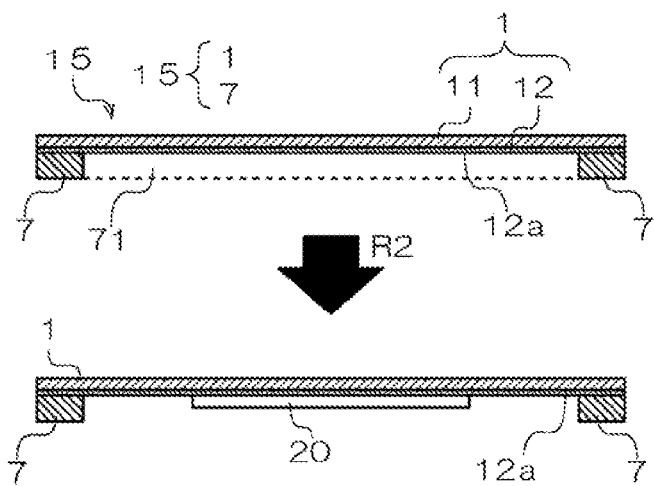
FIG. 3 is an illustrative drawing explaining a bonding step according to the present method for manufacturing a semiconductor component.

That is, each film 1 for component manufacture of Experiment Examples 1 to 8 (each 6 to 7 types) obtained in the above [1] was bonded to a metal frame 7 so as to cover an opening 71 of the frame 7 by bonding the adhesive layer 12 of each film 1 for component manufacture to one side of a frame body 7a to form a protecting member 15 (FIG. 2). Further, simultaneously with the formation of the protecting member 15, a 4 inch size silicon wafer was bonded to the adhesive layer 12 side.

Thereafter, the one surface 11a side of the base layer 11 of the protecting member 15 to which each film 1 for component manufacture was bonded was suctioned and fixed to an suction table set at each temperature (table surface temperature: 25° C., 75° C., 100° C., 160° C.). After lapse of 10 minutes, vacuum break was carried out, and each film 1 for component manufacture was removed from a wafer table by grasping the frame 7. In doing so, ease of removal from the wafer table was rated according the following criteria, and the result of rating was shown in Tables 2 to 5.

"○" . . . Film 1 could be removed regardless of the surface temperature of the suction table.

"Δ" . . . Film 1 could not be removed without waiting for the surface temperature of the suction table to fall, but it was able to be removed by the surface temperature drop.

"×" Even when the surface temperature of the suction table reached 25° C., it was difficult to remove.

The suction table used in this test is made of metal, and its surface roughness Ra is 0.48 μm and Rz is 2.64 μm. The measurement method is the same as in the case of the above-described film.

TABLE 2

|  |  |  | Test Temperature 25° C. | | | | | |
|---|---|---|---|---|---|---|---|---|
|  |  |  | Mirror Surface 1 | Mirror Surface 2 | Satin 1 | Satin 2 | Satin 3 | Sand Blast | Satin 4 |
|  |  |  | Ra (μm) | | | | | | |
|  |  |  | 0.01~0.05 | 0.05~0.15 | 0.20~0.35 | 0.20~0.40 | 0.50~0.70 | 0.55~0.70 | 1.5 |
|  |  |  | Rz (μm) | | | | | | |
| Experimental Examples |  |  | 0.35~0.55 | 0.60~0.70 | 2.50~2.80 | 3.00~3.20 | 4.30~4.45 | 6.00~7.00 | 10.7 |
| 1 | $R_{E1}$ = 0.4 | $R_{E2}$ = 0.03 | (1-1) × | (1-2) × | (1-3) ○ | (1-4) ○ | (1-5) ○ | (1-6) ○ | — |
| 2 | $R_{E1}$ = 0.4 | $R_{E2}$ = 0.03 | (2-1) × | (2-2) × | (2-3) ○ | (2-4) ○ | (2-5) ○ | (2-6) ○ | — |
| 3 | $R_{E1}$ = 0.34 | $R_{E2}$ = 0.001 | (3-1) × | (3-2) × | (3-3) ○ | (3-4) ○ | (3-5) ○ | (3-6) ○ | — |
| 4 | $R_{E1}$ = 0.72 | $R_{E2}$ = 0.14 | (4-1) × | (4-2) × | (4-3) ○ | (4-4) ○ | (4-5) ○ | (4-6) ○ | — |
| 5 | $R_{E1}$ = 0.25 | $R_{E2}$ = 0.06 | (5-1) × | (5-2) × | (5-3) ○ | (5-4) ○ | (5-5) ○ | (5-6) ○ | (5-7) ○ |
| 6 | $R_{E1}$ = 0.1 | $R_{E2}$ ≤ 0.01 | (6-1) × | (6-2) × | (6-3) ○ | (6-4) ○ | (6-5) ○ | (6-6) ○ | — |
| 7 | $R_{E1}$ = 0.1 | $R_{E2}$ ≤ 0.01 | (7-1) × | (7-2) × | (7-3) ○ | (7-4) ○ | (7-5) ○ | (7-6) ○ | — |
| 8 | $R_{E1}$ = 0.6 | $R_{E2}$ = 0.02 | (8-1) × | (8-2) × | (8-3) ○ | (8-4) ○ | (8-5) ○ | (8-6) ○ | (8-7) ○ |

TABLE 3

| Experimental Examples | | | Test Temperature 75° C. | | | | | | |
|---|---|---|---|---|---|---|---|---|---|
| | | | Mirror Surface 1 | Mirror Surface 2 | Satin 1 | Satin 2 | Satin 3 | Sand Blast | Satin 4 |
| | | | Ra (μm) | | | | | | |
| | | | 0.01~0.05 | 0.05~0.1.5 | 0.20~0.35 | 0.20~0.40 | 0.50~0.70 | 0.55~0.70 | 1.5 |
| | | | Rz (μm) | | | | | | |
| | | | 0.35~0.55 | 0.60~0.70 | 2.50~2.80 | 3.00~3.20 | 4.30~4.45 | 6.00~7.00 | 10.7 |
| 1 | $R_{E1} = 0.4$ | $R_{E2} = 0.03$ | (1-1) x | (1-2) x | (1-3) ○ | (1-4) ○ | (1-5) ○ | (1-6) ○ | — |
| 2 | $R_{E1} = 0.4$ | $R_{E2} = 0.03$ | (2-1) x | (2-2) x | (2-3) ○ | (2-4) ○ | (2-5) ○ | (2-6) ○ | |
| 3 | $R_{E1} = 0.34$ | $R_{E2} = 0.001$ | (3-1) x | (3-2) x | (3-3) ○ | (3-4) ○ | (3-5) ○ | (3-6) ○ | |
| 4 | $R_{E1} = 0.72$ | $R_{E2} = 0.14$ | (4-1) x | (4-2) x | (4-3) ○ | (4-4) ○ | (4-5) ○ | (4-6) ○ | |
| 5 | $R_{E1} = 0.25$ | $R_{E2} = 0.06$ | (5-1) x | (5-2) x | (5-3) ○ | (5-4) ○ | (5-5) ○ | (5-6) ○ | (5-7) ○ |
| 6 | $R_{E1} = 0.1$ | $R_{E2} \leq 0.01$ | (6-1) x | (6-2) x | (6-3) Δ | (6-4) Δ | (6-5) Δ | (6-6) Δ | — |
| 7 | $R_{E1} = 0.1$ | $R_{E2} \leq 0.01$ | (7-1) x | (7-2) x | (7-3) Δ | (7-4) Δ | (7-5) Δ | (7-6) Δ | |
| 8 | $R_{E1} = 0.6$ | $R_{E2} = 0.02$ | (8-1) x | (8-2) x | (8-3) ○ | (8-4) ○ | (8-5) ○ | (8-6) ○ | (8-7) ○ |

TABLE 4

| Experimental Examples | | | Test Temperature 100° C. | | | | | | |
|---|---|---|---|---|---|---|---|---|---|
| | | | Mirror Surface 1 | Mirror Surface 2 | Satin 1 | Satin 2 | Satin 3 | Sand Blast | Satin 4 |
| | | | Ra (μm) | | | | | | |
| | | | 0.01~0.05 | 0.05~0.15 | 0.20~0.35 | 0.20~0.40 | 0.50~0.70 | 0.55~0.70 | 1.5 |
| | | | Rz (μm) | | | | | | |
| | | | 0.35~0.55 | 0.60~0.70 | 2.50~2.80 | 3.00~3.20 | 4.30~4.45 | 6.00~7.00 | 10.7 |
| 1 | $R_{E1} = 0.4$ | $R_{E2} = 0.03$ | (1-1) x | (1-2) x | (1-3) ○ | (1-4) ○ | (1-5) ○ | (1-6) ○ | — |
| 2 | $R_{E1} = 0.4$ | $R_{E2} = 0.03$ | (2-1) x | (2-2) x | (2-3) ○ | (2-4) ○ | (2-5) ○ | (2-6) ○ | |
| 3 | $R_{E1} = 0.34$ | $R_{E2} = 0.001$ | (3-1) x | (3-2) x | (3-3) ○ | (3-4) ○ | (3-5) ○ | (3-6) ○ | |
| 4 | $R_{E1} = 0.72$ | $R_{E1} = 0.14$ | (4-1) x | (4-2) x | (4-3) ○ | (4-4) ○ | (4-5) ○ | (4-6) ○ | |
| 5 | $R_{E1} = 0.25$ | $R_{E2} = 0.06$ | (5-1) x | (5-2) x | (5-3) ○ | (5-4) ○ | (5-5) ○ | (5-6) ○ | (5-7) ○ |
| 8 | $R_{E1} = 0.6$ | $R_{E2} = 0.02$ | (8-1) x | (8-2) x | (8-3) ○ | (8-4) ○ | (8-5) ○ | (8-6) ○ | (8-7) ○ |

TABLE 5

| Experimental Examples | | | Test Temperature 160° C. | | | | | | |
|---|---|---|---|---|---|---|---|---|---|
| | | | Mirror Surface 1 | Mirror Surface 2 | Satin 1 | Satin 2 | Satin 3 | Sand Blast | Satin 4 |
| | | | Ra (μm) | | | | | | |
| | | | 0.01~0.05 | 0.05~0.15 | 0.20~0.35 | 0.20~0.40 | 0.50~0.70 | 0.55~0.70 | 1.5 |
| | | | Rz (μm) | | | | | | |
| | | | 0.35~0.55 | 0.60~0.70 | 2.50~2.80 | 3.00~3.20 | 4.30~4.45 | 6.00~7.00 | 10.7 |
| 1 | $R_{E1} = 0.4$ | $R_{E2} = 0.03$ | (1-1) x | (1-2) x | (1-3) ○ | (1-4) ○ | (1-5) ○ | (1-6) ○ | — |

TABLE 5-continued

| | | | Test Temperature 160° C. | | | | | |
|---|---|---|---|---|---|---|---|---|
| | | | Mirror Surface 1 | Mirror Surface 2 | Satin 1 | Satin 2 | Satin 3 | Sand Blast | Satin 4 |
| | | | Ra (μm) | | | | | | |
| | | | 0.01~0.05 | 0.05~0.15 | 0.20~0.35 | 0.20~0.40 | 0.50~0.70 | 0.55~0.70 | 1.5 |
| | | | Rz (μm) | | | | | | |
| Experimental Examples | | | 0.35~0.55 | 0.60~0.70 | 2.50~2.80 | 3.00~3.20 | 4.30~4.45 | 6.00~7.00 | 10.7 |
| 2 | $R_{E1}=0.4$ | $R_{E2}=0.03$ | (2-1) x | (2-2) x | (2-3) ○ | (2-4) ○ | (2-5) ○ | (2-6) ○ | |
| 3 | $R_{E1}=0.34$ | $R_{E2}=0.001$ | (3-1) x | (3-2) x | (3-3) Δ | (3-4) Δ | (3-5) Δ | (3-6) Δ | |
| 4 | $R_{E1}=0.72$ | $R_{E1}=0.14$ | (4-1) x | (4-2) x | (4-3) ○ | (4-4) ○ | (4-5) ○ | (4-6) ○ | |
| 5 | $R_{E1}=0.25$ | $R_{E2}=0.06$ | (5-1) x | (5-2) x | (5-3) ○ | (5-4) ○ | (5-5) ○ | (5-6) ○ | (5-7) ○ |
| 8 | $R_{E1}=0.6$ | $R_{E2}=0.02$ | (8-1) x | (8-2) x | (8-3) ○ | (8-4) ○ | (8-5) ○ | (8-6) ○ | (8-7) ○ |

[3] Effect of Examples

As shown in Table 2, films for component manufacture in which the surface roughness on one surface 11a side of the base layer 11 is 0.01≤Ra (μm)≤0.05 and 0.35≤Rz (μm)≤0.55 (Experiment Examples 1-1, 2-1, 3-1, 4-1, 5-1, 6-1, 7-1, 8-1) were difficult to remove even when the surface temperature of the suction table was 25° C., irrespective of the material constituting the base layer 11. In addition, films for component manufacture in which the surface roughness is 0.05≤Ra (μm)≤0.15 and 0.60≤Rz (μm)≤0.70 (Experiment Examples 1-2, 2-2, 3-2, 4-2, 5-2, 6-2, 7-2, 8-2) were difficult to remove even when the surface temperature of the suction table was 25° C., irrespective of the material constituting the base layer 11.

On the other hand, films 1 for component manufacture having surface roughness of 0.1≤Ra (μm)≤2.0 and 1.0≤Rz (μm)≤15 could be easily removed from the suction table with the surface temperature of 25° C.

As shown in Table 3, even when the surface roughness on the one surface 11a side of the base layer 11 of the film 1 for component manufacture is 0.1≤Ra (μm)≤2.0 and 1.0≤Rz (μm)≤15, in Experiment Examples 6 (Experiment Examples 6-1 to 6-6) and Experiment Examples 7 (Experiment Examples 7-1 to 7-6) in which the $R_{E1}$ of the base layer was 0.10, it was difficult to remove the film without waiting for the surface temperature of the suction table to fall after the test (75° C.), but it was possible to remove the film by drop of the surface temperature of the suction table.

In contrast to this, films 1 for component manufacture in which the surface roughness on one surface 11a side of the base layer 11 of the film 1 for component manufacture is 0.1≤Ra (μm)≤2.0 and 1.0≤Rz (μm)≤15 and in which the $R_{E1}$ of the base layer is 0.2≤$R_{E1}$≤1 and E'(25) is 35 MPa or more and 3500 MPa or less, could be easily removed from the suction table with the surface temperature of 75° C.

As shown in Table 4, films 1 for component manufacture in which the surface roughness on one surface 11a side of the base layer 11 of the film 1 for component manufacture is 0.1≤Ra (μm)≤2.0 and 1.0≤Rz (μm)≤15 and in which the $R_{E2}$ of the base layer is 0.01≤$R_{E2}$≤1, could be easily removed from the suction table even in a state in which the surface temperature is 100° C.

As shown in Table 5, even when the surface roughness on the one surface 11a side of the base layer 11 of the film 1 for component manufacture is 0.1≤Ra (μm)≤2.0 and 1.0≤Rz (μm)≤15, in Experiment Examples 3 (Experiment Examples 3-1 to 3-6) in which the $R_{E2}$ of the base layer was 0.001, it was difficult to remove the film without waiting for the surface temperature of the suction table to fall after the test (160° C.), but it was possible to remove the film by drop of the surface temperature of the suction table.

On the other hand, films 1 for component manufacture in which the surface roughness on one surface 11a side of the base layer 11 of the film 1 for component manufacture is 0.1≤Ra (μm)≤2.0 and 1.0≤Rz (μm)≤15 and in which the $R_{E2}$ of the base layer is 0.01≤$R_{E2}$≤1, could be easily removed from the suction table even in a state in which the surface temperature is 160° C.

In addition, in the present invention, the invention is not limited to the above-mentioned specific embodiments, and widely different embodiments of this invention may be made within the scope of the invention according to the object and the use of the invention.

INDUSTRIAL APPLICABILITY

The film for manufacturing semiconductor component, the method for manufacturing a semiconductor component, the film for electronic component manufacture, and the method for manufacturing an electronic component of the present invention are widely used in uses of semiconductor component manufacture and electronic component manufacture.

Particularly, these films and manufacturing methods of the present invention are suitably used in manufacturing components with excellent productivity since when using the method for manufacturing a semiconductor component or the method for manufacturing an electronic component respectively including an evaluation step accompanied by a change in temperature, a segmenting step and a pickup step, these films can be used commonly in these steps.

REFERENCE SIGNS LIST

1; Film for manufacturing semiconductor component, film for electronic component manufacture
15; Protecting member
11; Base Layer 12; Adhesive Layer
12a; Surface of an adhesive layer (surface of an adhesive layer 12 that is exposed via an opening 71)
20; Semiconductor wafer
21; Semiconductor component
30; Sealing material
50; Array-shaped electronic component
51; Electronic component
7; Frame
7a; One side of a frame
71; Opening of a frame
8; Probe card
81; Probe
90; Suction table
91; Stopper
92; Pushing-up member
93; Pickup instrument
R1; Protecting member forming step
R2; Bonding step
R3; Evaluation step (semiconductor wafer evaluation step, array-shaped electronic component evaluation step)
R4; Segmenting step
R5; Evaluation step (semiconductor component evaluation step, electronic component evaluation step)
R6; Film-isolating step
R7; Component-isolating step
R8; Pickup step

The invention claimed is:

1. A method for manufacturing a semiconductor component comprising:
a bonding step of bonding an adhesive layer of a film for manufacturing semiconductor components to a second surface of a semiconductor wafer having circuits formed on a first surface, the film comprising the adhesive layer formed of an energy-non-curing adhesive which is not cured by energy rays and a base layer provided on one surface side of the adhesive layer, and the ratio REI E(100)/E(25)) of the elastic modulus F(100) of the base layer at 100° C. to the elastic modulus E(25) of the base layer at 25° C. is such that $0.2 \leq R_{E1} \leq 1$, and the elastic modulus E'(25) is 35 MPa or more and 3500 MPa or less,
a segmenting step of separating the semiconductor wafer into segments in a state in which the adhesive layer of the film is bonded to the second surface of the semiconductor wafer,
an evaluation step of evaluating the semiconductor wafer or the semiconductor components at a temperature of 75° C. or higher, and
a pickup step of separating the semiconductor components from the adhesive layer,
wherein an arithmetic average roughness (Ra) of the surface of one side of the base layer on which the adhesive layer is not provided is 0.1 µm or more and 2.0 µm or less, and a maximum height (Rz) is 1.0 µm or more and 15 µm or less,
wherein the evaluation step further comprises:
either before or after the segmenting step and prior to the pickup step, a film-suction step of suctioning and fixing the base layer to a suction table, and
a film-isolating step of separating the suction table and the film from each other before a temperature of the suction table becomes room temperature after the evaluation step.

2. The method for manufacturing a semiconductor component according to claim 1, wherein the ratio $R_{E2}$ (=E'(160)/E'(−40)) of the elastic modulus E'(160) of the base layer at 160° C. to the elastic modulus E'(−40) of the base layer at −40° C. is such that $0.01 \leq R_{E2} \leq 1$.

3. The method for manufacturing a semiconductor component according to claim 1, wherein the base layer contains at least one of a thermoplastic polyester-based elastomer, a thermoplastic polyamide-based elastomer, and polybutylene terephthalate.

4. The method for manufacturing a semiconductor component according to claim 1, wherein the evaluation step is a step of evaluating the electrical properties of the semiconductor wafer or the semiconductor component.

5. A method for manufacturing an electronic component comprising:
a bonding step of bonding an adhesive layer of a film or manufacturing electronic components to a back surface of an array-shaped electronic component, in which semiconductor components are sealed in an array configuration, the film comprising the adhesive layer formed of an energy-non-curing adhesive which is not cured by energy rays and a base layer provided on one surface side of the adhesive layer, and the ratio $R_{E1}$ (=E'(100)/E'(25)) of the elastic modulus E'(100) of the base layer at 100° C. to the elastic modulus E'(25) of the base layer at 25° C. is such that $0.2 \leq R_{E1} \leq 1$, and the elastic modulus E'(25) is 35 MPa or more and 3500 MPa or less,
a segmenting step of separating the array-shaped electronic component into segments in a state in which the adhesive layer of the film is bonded to a back surface of the array-shaped electronic component to obtain electronic components,
an evaluation step of evaluating the array-shaped electronic component or the electronic components at a temperature of 75° C. or higher, and
a pickup step of separating the electronic components from the adhesive layer,
wherein an arithmetic average roughness (Ra) of the surface of one side of the base layer on which the adhesive layer is not provided is 0.1 µm or more and 2.0 µm or less, and a maximum height (Rz) is 1.0 µm or more and 15 µm or less,
wherein the evaluation step further comprises:
either before or after the segmenting step and prior to the pickup step, a film-suction step of suctioning and fixing the base layer to a suction table, and
a film-isolating step of separating the suction table and the film from each other before a temperature of the suction table becomes room temperature after the evaluation step.

6. The method for manufacturing an electronic component according to claim 5, wherein the ratio $R_{E2}$ (=E'(160)/E'(−40)) of the elastic modulus F(160) of the base layer at 160° C. to the elastic modulus E'(−40) of the base layer at −40° C. is such that $0.01 \leq R_{E2} \leq 1$.

7. The method for manufacturing an electronic component according to claim 5, wherein the base layer contains at least one of a thermoplastic polyester-based elastomer, a thermoplastic polyimide-based elastomer, and polybutylene terephthalate.

8. The method for manufacturing an electronic component according to claim 5, wherein the evaluation step is a step of evaluating the electrical properties of the array-shaped electronic component or the electronic components.

* * * * *